United States Patent
Kim et al.

(10) Patent No.: US 10,867,555 B2
(45) Date of Patent: Dec. 15, 2020

(54) LIGHT EMITTING DISPLAY APPARATUS

(71) Applicant: LG Display Co., Ltd., Seoul (KR)

(72) Inventors: Taegung Kim, Osan-si (KR);
Kyung-Rok Kim, Osan-si (KR);
Juyoung Noh, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 3 days.

(21) Appl. No.: 16/223,039

(22) Filed: Dec. 17, 2018

(65) Prior Publication Data

US 2019/0206324 A1 Jul. 4, 2019

(30) Foreign Application Priority Data

Dec. 29, 2017 (KR) .................. 10-2017-0184848

(51) Int. Cl.
*G09G 3/3241* (2016.01)
*G09G 3/32* (2016.01)

(52) U.S. Cl.
CPC .............. *G09G 3/3241* (2013.01); *G09G 3/32* (2013.01); *G09G 2310/027* (2013.01); *G09G 2310/061* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 7,298,368 B2 * | 11/2007 | Anderson | ................ | G09G 3/20 |
| | | | | 345/205 |
| 10,163,383 B2 * | 12/2018 | Lee | ................ | G09G 3/2092 |
| 2005/0200617 A1 * | 9/2005 | Kwak | ................ | H05B 45/37 |
| | | | | 345/204 |
| 2008/0088568 A1 * | 4/2008 | Haga | ................ | G09G 3/18 |
| | | | | 345/100 |
| 2015/0154905 A1 * | 6/2015 | Takanohashi | ........ | G09G 3/3225 |
| | | | | 345/207 |
| 2016/0019856 A1 * | 1/2016 | Tanaka | ................ | G09G 3/3648 |
| | | | | 345/206 |
| 2017/0261828 A1 * | 9/2017 | Noma | ................ | G02F 1/1368 |
| 2017/0330508 A1 * | 11/2017 | Saito | ................ | G09G 3/3275 |
| 2019/0206319 A1 * | 7/2019 | Kim | ................ | G09G 3/2022 |

FOREIGN PATENT DOCUMENTS

CN 104200772 A 12/2014

* cited by examiner

*Primary Examiner* — Dorothy Harris
(74) *Attorney, Agent, or Firm* — Polsinelli PC

(57) ABSTRACT

Disclosed is a light emitting display apparatus. The light emitting display apparatus includes a plurality of pixels provided in a display area of a substrate and connected to a data line, a clock line, and a pixel driving power line. The plurality of pixels each include a pixel driving chip connected to the data line, the clock line, and the pixel driving power line to sequentially output a driving current through a plurality of output terminals thereof and a plurality of light emitting devices respectively connected to the plurality of output terminals. Accordingly, a gate driving circuit and a gate line connected to the gate driving circuit are removed from one end of a display panel and omitted, thereby minimizing the number of pad parts disposed in the display panel.

23 Claims, 9 Drawing Sheets

LIGHT EMITTING DISPLAY APPARATUS

CROSS REFERENCE TO RELATED APPLICATION

This application claims the benefit of the Korean Patent Application No. 10-2017-0184848 filed on Dec. 29, 2017, which is hereby incorporated by reference in its entirety as if fully set forth herein.

BACKGROUND

Field of the Disclosure

The present disclosure relates to a display apparatus, and more particularly, to a light emitting display apparatus. Although the present disclosure is suitable for a wide scope of applications, it is particularly suitable for minimizing a bezel area of a display panel of the light emitting display apparatus.

Description of the Background

Recently, with the advancement of multimedia, the importance of display apparatuses is increasing. Therefore, flat panel display apparatuses such as liquid crystal display (LCD) apparatuses, organic light emitting display apparatuses, and light emitting diode display apparatuses are currently commercialized. The LCD apparatuses and the organic light emitting display apparatuses among the flat panel display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

A related art light emitting display apparatus includes a display panel that includes a plurality of data lines, a plurality of gate lines, and a plurality of pixels connected to a corresponding data line and a corresponding scan line, a data driving circuit that supplies data signals to the data lines, and a gate driving circuit that supplies a gate signal to the plurality of gate lines. Also, each of the plurality of pixels is supplied with a data signal supplied through a corresponding data line from the data driving circuit in synchronization with the gate signal supplied through a corresponding gate line from the gate driving circuit, thereby displaying an image corresponding to the data signal.

The display panel of the related art light emitting display apparatus includes a pad part connected to the data driving circuit and the gate driving circuit, but a bezel area cannot be avoided due to a space where the pad part is disposed. That is, in the related art light emitting display apparatus, a data pad part connected to the data driving circuit is disposed in one end of the display panel, and a gate pad part connected to the gate driving circuit is disposed in the other end vertical to the one end of the display panel. Due to this, the bezel area cannot be completely removed.

SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus in which a plurality of pixel driving chips connected to one another in cascade by a clock line are provided, and thus, a gate driving circuit and a gate line connected to the gate driving circuit are removed from one end of a display panel and omitted, thereby minimizing the number of pad parts disposed in the display panel.

Another aspect of the present disclosure is directed to providing a light emitting display apparatus in which a plurality of pixel driving chips cascade-connected to one another by a clock line are provided, and thus, the number of pad parts disposed in a display panel is minimized, thereby minimizing a bezel area of the display panel.

Another aspect of the present disclosure is directed to providing a light emitting display apparatus in which a clock signal received from a pixel driving chip of a front stage pixel is shifted and supplied to a pixel driving chip of a rear stage pixel, and thus, a plurality of light emitting devices respectively provided in a plurality of pixels are time-divisionally driven even without a gate driving circuit and a gate line.

Another aspect of the present disclosure is directed to providing a light emitting display apparatus in which, even without a separate gate driving chip, a plurality of pixels are driven through only a clock line connecting a data driving chip to the plurality of pixels in cascade, and thus, the manufacturing cost of the light emitting display apparatus is reduced.

A further aspect of the present disclosure is directed to a light emitting display apparatus including a plurality of pixels each connected to a clock line, a data line and a pixel power line includes a plurality of pixel driving chips in each pixel respectively connected to a plurality of data lines and a plurality of pixel driving power lines and sequentially outputting a driving current through a plurality of output terminals, wherein the clock line is first connected pixel driving chips among the plurality of pixels arranged along a first horizontal line and sequentially connected to pixel driving chips among the plurality of pixels arranged along second to nth horizontal lines, where n is a natural number equal to or more than three; and a plurality of light emitting devices respectively connected to the plurality of output terminals and sequentially receiving the driving current to emit light of different colors during a unit frame.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a plurality of pixels provided in a display area of a substrate and connected to a data line, a clock line, and a pixel driving power line, wherein the plurality of pixels each include a pixel driving chip connected to the data line, the clock line, and the pixel driving power line to sequentially output a driving current through a plurality of output terminals thereof and a plurality of light emitting devices respectively connected to the plurality of output terminals.

Details of other aspects are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
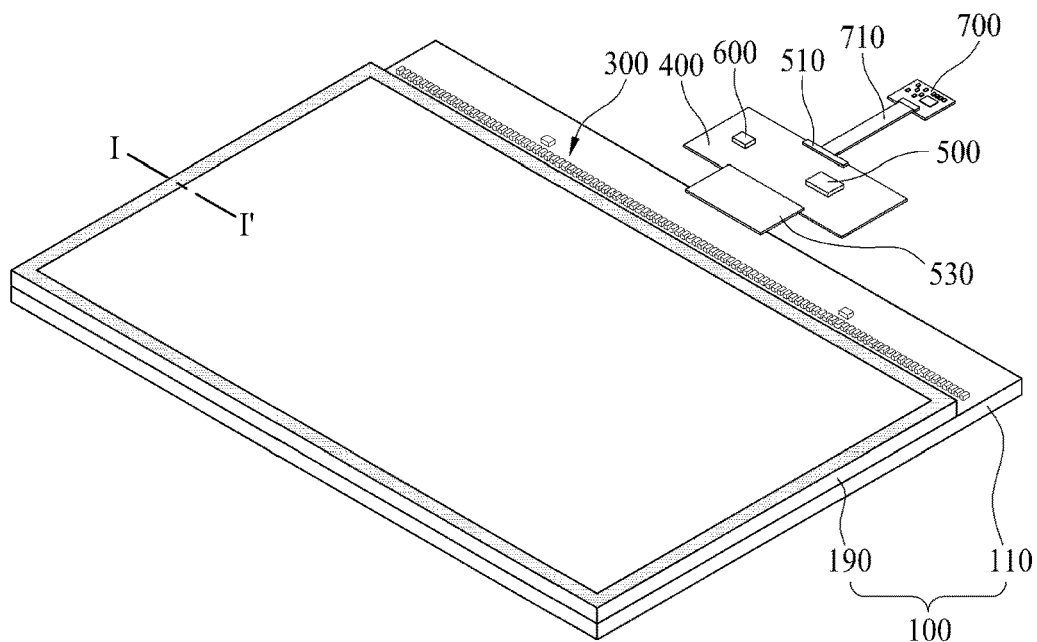
FIG. 1 is a diagram illustrating a light emitting display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
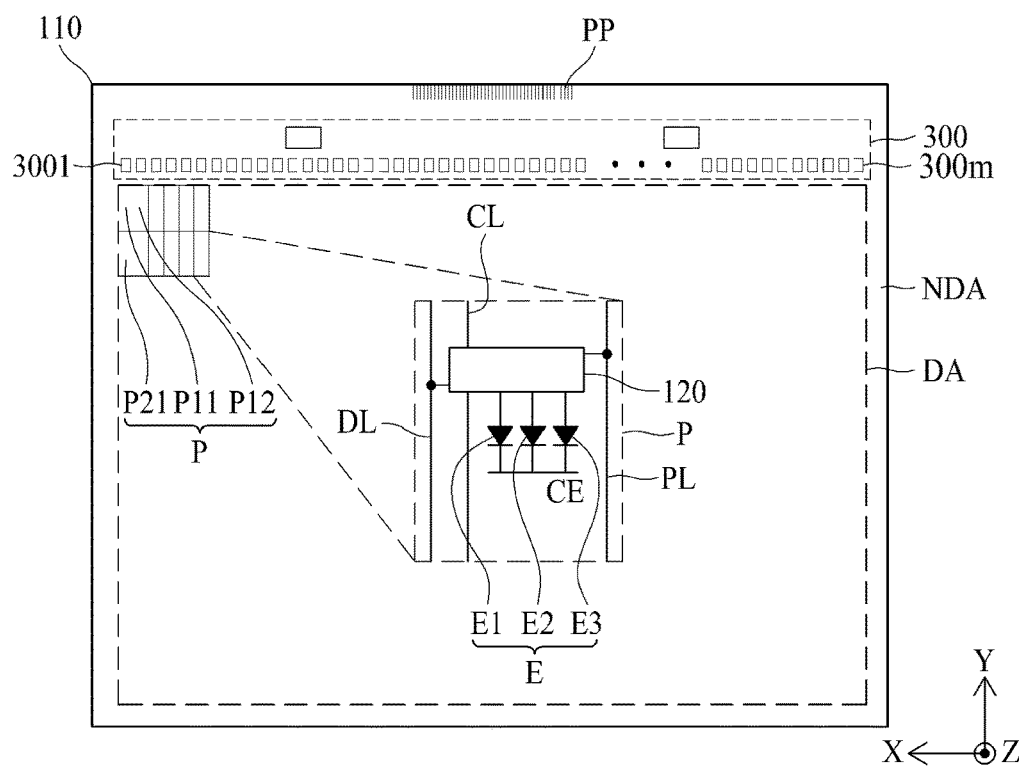
FIG. 2 is a plan view illustrating a substrate illustrated in FIG. 1.
Figure 3:
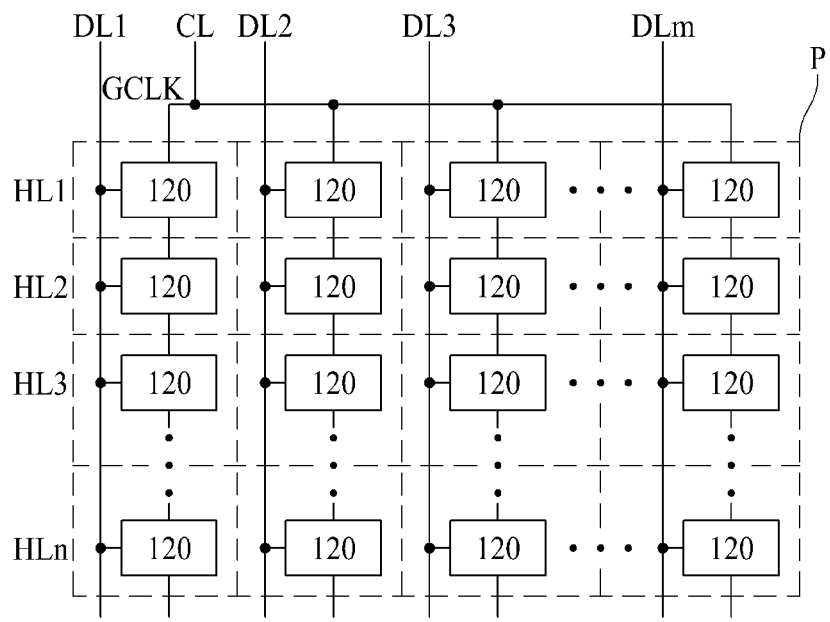
FIG. 3 is a diagram illustrating a connection relationship between a clock line and pixel driving chips of a plurality of pixels in the light emitting display apparatus illustrated in FIG. 1.
Figure 4:
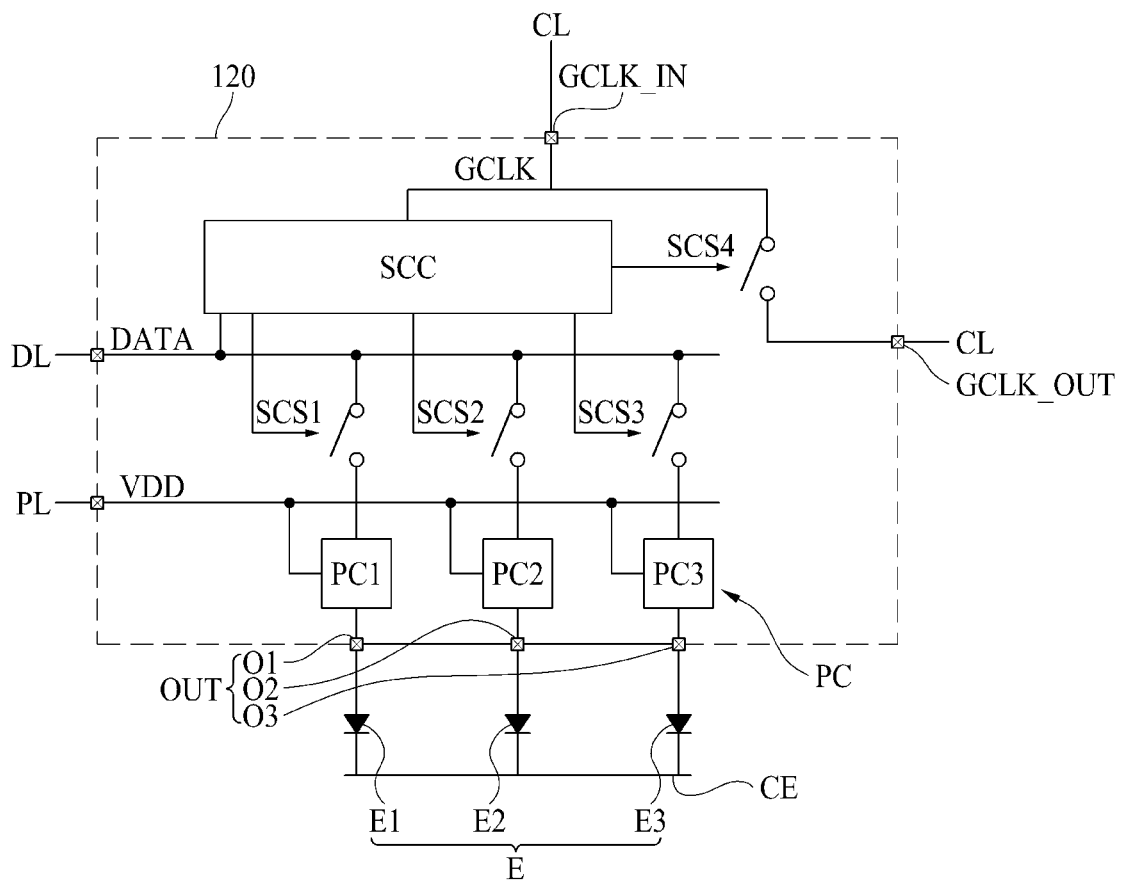
FIG. 4 is a diagram illustrating one pixel illustrated in FIG. 2.

FIG. 1 is a diagram illustrating a light emitting display apparatus according to an aspect of the present disclosure. FIG. 2 is a plan view illustrating a substrate illustrated in FIG. 1. FIG. 3 is a diagram illustrating a connection relationship between a clock line and pixel driving chips of a plurality of pixels in the light emitting display apparatus illustrated in FIG. 1. FIG. 4 is a diagram illustrating one pixel illustrated in FIG. 2.

Referring to FIGS. 1 to 4, the light emitting display apparatus according to an aspect of the present disclosure may include a display panel 100 and a data driving chip array part 300 mounted on the display panel 100.

The display panel 100 may include a substrate 110 and an opposite substrate 190, which face each other. Here, the substrate 110 may be a pixel array substrate, and the opposite substrate 190 may be a color filter array substrate including a color filter. Also, the substrate 110 may have a size which is larger than that of the opposite substrate 190, and thus, one edge of the substrate 110 may be exposed without being covered by the opposite substrate 190.

The substrate 110, a base substrate, may be formed of an insulating material such as glass, quartz, ceramic, or plastic. For example, the substrate 110 including plastic may be a polyimide film, and particularly, may be a heat-resistant polyimide film capable of enduring a high temperature in a high temperature deposition process. The substrate 110 may include a display area DA including a plurality of pixel areas and a non-display area NDA. The display area DA may be defined as an area which displays an image, and the non-display area NDA may be an area which does not display an image and may be defined in an edge of the substrate 110 to surround the display area DA.

According to an aspect, the substrate 100 may include first to $m^{th}$ data lines data lines DL which pass through a display area DA in a second direction Y. Also, the substrate 110 may include first to $m^{th}$ pixel driving power lines PL parallel to the first to $m^{th}$ data lines DL.

According to an aspect, the substrate 110 may include a plurality of pixels P for displaying an image. The plurality of pixels P may each include a pixel driving chip 120 and a plurality of light emitting devices E.

Pixel driving chips 120 of the plurality of pixels P may be respectively provided in a plurality of pixel areas and may be connected to one another by a clock line CL in cascade, and each of the pixel driving chips 120 may be connected to an adjacent data line DL and an adjacent pixel driving power line PL. In detail, each of the pixel driving chips 120 may be connected to a clock line CL connected to a pixel driving chip 120 of a front stage pixel P through a clock input terminal GCLK_IN and may be connected to a clock line CL connected to a pixel driving chip 120 of a rear stage pixel P through a clock output terminal GCLK_OUT. That is, the pixel driving chips 120 of the plurality of pixels P may be cascade-connected to one another by the clock line CL. Also, each of the pixel driving chips 120 of the plurality of pixels P may be connected to a plurality of light emitting devices E through a plurality of output terminals OUT. According to an aspect, each of the pixel driving chips 120 may be a minimum-unit microchip or one chipset and may be a semiconductor packaging device which includes a plurality of transistors and at least one capacitor and has a fine size.

Each of the pixel driving chips 120 may sequentially output a driving current Id through the plurality of output terminals OUT. For example, each of the pixel driving chips 120 may include first to third output terminals O1 to O3 respectively connected to first to third light emitting devices E1 to E3. Therefore, the light emitting display apparatus according to the present disclosure may drive the first to third light emitting devices E1 to E3 by using one driving pixel chip 120, thereby decreasing, by a factor of ⅓, the number of pixel driving chips 120 mounted on the substrate, reducing a mount process time for the pixel driving chips 120 to decrease the manufacturing cost of the light emitting display apparatus, and enhancing the reliability of the light emitting display apparatus. As another example, the light emitting display apparatus according to the present disclosure may drive a plurality of light emitting devices E by using one driving pixel chip 120, thereby decreasing the number of pixel driving chips 120 mounted on the substrate. Here, the number of light emitting devices E driven by one pixel driving chip 120 may be adjusted based on a design condition of the light emitting display apparatus.

Each of the pixel driving chips 120 may receive a clock signal GCLK through a clock line CL connected to a pixel driving chip 120 of a front stage pixel P, shift the received clock signal GCLK, and supply the shifted clock signal GCLK to a pixel driving chip 120 of a rear stage pixel P. Here, the clock line CL may be disposed in parallel with a data line DL in the second direction Y. Also, a first direction X may be parallel to a plurality of horizontal lines (for example, first to $n^{th}$ horizontal lines) HL1 to HLn. According to an aspect, a plurality of pixels P arranged in parallel with the data line DL in the second direction Y may be connected to one another in parallel, but a plurality of pixels P arranged in parallel with the clock line CL in the second direction Y may be serially connected (or cascade-connected) to one another. Therefore, the clock line CL may be first connected to pixel driving chips 120 of pixels P arranged along the first horizontal line HL1 and may be sequentially connected to pixel driving chips 120 of pixels P arranged along the second to $n^{th}$ horizontal line HL2 to HLn. In this manner, whenever the clock line CL passes through pixel driving chips 120 of pixels P arranged along the first to $n^{th}$ horizontal line HL1 to HLn, the clock line CL may transmit a shifted clock signal GCLK to a pixel driving chip 120 of a rear stage pixel P.

According to an aspect, the clock line CL may be first connected to pixel driving chips 120 of pixels P arranged along the first horizontal line HL1 and may transmit an initial clock signal GCLK (or a reference clock) which is not shifted. At this time, pixel driving chips 120 of pixels P arranged along the first horizontal line HL1 may shift an initial clock signal GCLK received through a clock input terminal GCLK_IN and may supply a once-shifted clock signal GCLK to pixel driving chips 120 of pixels P arranged along the second horizontal line HL2 through a clock output terminal GCLK_OUT. Also, the pixel driving chips 120 of the pixels P arranged along the second horizontal line HL2 may shift the once-shifted clock signal GCLK received through a clock input terminal GCLK_IN once more and may supply a twice-shifted clock signal GCLK to pixel driving chips 120 of pixels P arranged along the third horizontal line HL3 through a clock output terminal GCLK_OUT. In this manner, the pixel driving chips 120 of the pixels P arranged along the n−$1^{th}$ horizontal line HLn−1 may supply a (n−1)-times-shifted clock signal GCLK to pixel driving chips 120 of pixels P arranged along the $n^{th}$ horizontal line HL3 through the clock line CL.

Here, a period in which a clock signal GCLK is shifted once may be determined based on the number of light emitting devices E which are driven by one pixel driving chip 120 during a unit frame, but is not limited thereto. For example, in a case where one pixel driving chip 120 drives the first to third light emitting devices E1 to E3 during a unit frame, the pixel driving chip 120 may shift the clock signal GCLK by three periods and may supply the shifted clock signal GCLK to a pixel driving chip 120 of a rear stage pixel P.

Each of the pixel driving chips 120 may receive a data signal DATA through the data line DL, receive a shifted clock signal GCLK through the clock line CL, and receive a pixel driving voltage VDD through the pixel driving power line PL, thereby sequentially supplying the driving current Id to the plurality of light emitting devices E. For example, when the clock signal GCLK is counted once, each of the pixel driving chips 120 may supply the driving current Id to the first light emitting device E1, and when the clock signal GCLK is counted twice, each of the pixel driving chips 120 may supply the driving current Id to the second light emitting device E2. Also, when the clock signal GCLK is counted three times, each of the pixel driving chips 120 may supply the driving current Id to the third light emitting device E3. Also, when the clock signal GCLK is counted four times, each of the pixel driving chips 120 may shift the clock signal GCLK and may supply the shifted clock signal GCLK to a pixel driving chip 120 of a rear stage pixel P. Therefore, each of the pixel driving chips 120 may sequentially drive the plurality of light emitting devices E of a corresponding pixel P, and then, may shift the clock signal GCLK to supply the shifted clock signal GCLK to a pixel driving chip 120 of a rear stage pixel P. At this time, the pixel driving chip 120 of the rear stage pixel P may sequentially drive the plurality of light emitting devices E thereof from a time when the shifted clock signal GCLK is received. That is, a pixel driving chip 120 of a 1-1$^{th}$ pixel P11 may sequentially drive the plurality of light emitting devices E thereof, and then, a pixel driving chip 120 of a 2-1$^{th}$ pixel P21 may sequentially drive the plurality of light emitting devices E thereof.

The plurality of light emitting devices E may respectively and sequentially receive the driving current Id from the plurality of output terminals OUT to output lights of different colors during a unit frame. Here, the lights emitted from the plurality of light emitting devices E may be output to the outside through the opposite substrate 190, or may be output to the outside through the substrate 110. According to an aspect, the plurality of light emitting devices E may include the first to third light emitting devices E1 to E3 respectively connected to the first to third output terminals O1 to O3 of each of the pixel driving chips 120. Here, each of the first to third light emitting devices E1 to E3 may emit one of red light, green light, and blue light. For example, the first light emitting device E1 may receive the driving current Id through the first output terminal O1 to emit red light. Also, the second light emitting device E2 may receive the driving current Id through the second output terminal O2 to emit green light. Also, the third light emitting device E3 may receive the driving current Id through the third output terminal O3 to emit blue light.

According to an aspect, the plurality of light emitting devices E may include an anode electrode (or a first electrode) connected to a corresponding pixel driving chip 120, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including an organic light emitting layer (or an inorganic light emitting layer) a quantum dot light emitting layer.

Each of the pixel driving chips 120 may include a switch control circuit SCC and a plurality of pixel driving circuits PC.

The switch control circuit SCC may be connected to the data line DL and the clock line CL and may output a plurality of driving switch control signals (for example, first to third driving switch control signals) SCS1 to SCS3 and a shift switch control signal SCS4. For example, in a case where each of the pixel driving chips 120 sequentially drives the first to third light emitting devices E1 to E3, each of the pixel driving chips 120 may include first to third pixel driving circuits PC1 to PC3, and the switch control circuit SCC may output the first to third driving switch control signals SCS1 to SCS3 and the shift switch control signal SCS4.

In detail, when the clock signal GCLK is applied through the clock line CL, the switch control circuit SCC may count the clock signal GCLK. Also, whenever the switch control circuit SCC counts the clock signal GCLK, the switch control circuit SCC may sequentially output the first to third driving switch control signals SCS1 to SCS3, and when an output of each of the first to third driving switch control signals SCS1 to SCS3 is completed, the switch control circuit SCC may output the shift switch control signal SCS4. Therefore, the switch control circuit SCC may count the clock signal GCLK to output the first to third driving switch control signals SCS1 to SCS3 and the shift switch control signal SCS4, and thus, a gate line and a gate driving circuit for applying a gate pulse through the gate line may not separately be provided. Therefore, the light emitting display apparatus according to the present disclosure may time-divisionally drive the plurality of light emitting devices E of each pixel P even without separately including the gate line and the gate driving circuit. Also, in the light emitting display apparatus according to the present disclosure, the number of pad parts PP disposed in the display panel 100 may be minimized, and thus, a bezel area of the display panel 100 may be minimized, thereby reducing the manufacturing cost of the light emitting display apparatus.

According to an aspect, the first to third light emitting devices E1 to E3 may sequentially receive the driving current Id, based on the first to third driving switch control signals SCS1 to SCS3 and may emit lights of different colors. For example, the first light emitting device E1 may receive the driving current Id from the first pixel driving circuit PC1, based on the first driving switch control signal SCS1 and may emit red light. Also, the second light emitting device E2 may receive the driving current Id from the second pixel driving circuit PC2, based on the second driving switch control signal SCS2 and may emit green light. Also, the third light emitting device E3 may receive the driving current Id from the third pixel driving circuit PC3, based on the third driving switch control signal SCS3 and may emit blue light. Also, when the first to third light emitting devices E1 to E3 have sequentially received the driving current Id, the first to third light emitting devices E1 to E3 may not temporarily be driven until the driving current Id is again received during a next unit frame.

Each of the plurality of pixel driving circuits PC may be connected to the data line DL and the pixel driving power line PL and may output the driving current Id. In detail, the pixel driving circuit PC may receive the data signal DATA through the data line DL and may receive the pixel driving voltage VDD through the pixel driving power line PL. Here, the plurality of pixel driving circuits PC may be supplied with the data signal DATA, based on the driving switch control signals SCS1 to SCS3, and thus, the plurality of pixel driving circuits PC may respectively and sequentially supply the driving current Id to the plurality of light emitting devices E even without receiving a separate pulse signal. Accordingly, the light emitting display apparatus according to the present disclosure may time-divisionally drive the plurality of light emitting devices E of each pixel P even without separately including the gate line and the gate driving circuit.

According to an aspect, the data signal DATA may include data information for determining amplitude of the driving current Id. Also, the data information about the data signal DATA may be implemented as a digital type or an analog type. Here, the data information may be used to determine a luminance of light emitted from each of the plurality of light emitting devices E.

The opposite substrate 190 may cover the plurality of pixels P provided on the substrate 110. For example, the opposite substrate 190 may be a glass substrate, a flexible substrate, a plastic film, or the like. Also, the opposite substrate 190 may be a polyethylene terephthalate film, a polyimide film, or the like. The opposite substrate 190 may be bonded to the substrate 110 by a transparent adhesive layer.

The data driving chip array part 300 may be provided in the non-display area NDA of the substrate 110 and may be connected to the first to $m^{th}$ data lines DL. In detail, the data driving chip array part 300 may convert a data signal, supplied through a pad part PP disposed in a first non-display area (or an upper non-display area) of the substrate 110, into a data voltage and may supply the data voltage to a corresponding data line of the first to $m^{th}$ data lines DL. For example, the data driving chip array part 300 may include a plurality of data driving chips for respectively supplying data voltages to the first to $m^{th}$ data lines DL.

According to an aspect, the light emitting display apparatus may further include a control board 400, a timing controller 500, a power management circuit 600, and a display driving system 700.

The control board 400 may be connected to, through a signal cable 530, the pad part PP disposed in one non-display area of the substrate 110.

The timing controller 500 may be mounted on the control board 400. The timing controller 500 may perform signal processing on an image signal input thereto to generate a digital data signal and may supply the digital data signal to the data driving chip array part 300. That is, the timing controller 500 may receive the image signal and a timing synchronization signal supplied from the display driving system 700 through a user connector 510 provided on the control board 400. The timing controller 500 may align the image signal to generate the digital data signal matching a pixel arrangement structure of the display area DA, based on the timing synchronization signal and may supply the generated digital data signal to the data driving chip array part 300. According to an aspect, the timing controller 500 may supply the digital data signal, a reference clock, and a data start signal to the data driving chip array part 300 by using a high speed serial interface manner (for example, an embedded point to point interface (EPI) manner, a low-voltage differential signaling (LVDS) interface manner, or a mini LVDS interface manner).

Moreover, the timing controller 500 may generate the reference clock and the data start signal, based on the timing synchronization signal and may supply the reference clock and the data start signal to the data driving chip array part 300.

The power management circuit 600 may generate a transistor logic voltage, a ground voltage, a pixel driving voltage, and a plurality of reference gamma voltages, based on an input power supplied from a power supply of the display driving system 700. Each of the transistor logic voltage and the ground voltage may be used as a driving voltage for the timing controller 500 and the data driving chip array part 300, and the ground voltage and the pixel driving voltage may be applied to the data driving chip array part 300 and the plurality of pixels P. Also, the plurality of reference gamma voltages may be used for the data driving chip array part 300 to convert digital data into an analog data voltage.

The display driving system 700 may be connected to the user connector 510 of the control board 500 through a signal transmission member 710. The display driving system 700 may generate the image signal from a video source and may supply the image signal to the timing controller 500. Here, the image signal may be supplied to the timing controller 500 by using the high speed serial interface manner (for example, a V-by-One interface manner).

Figure 5:
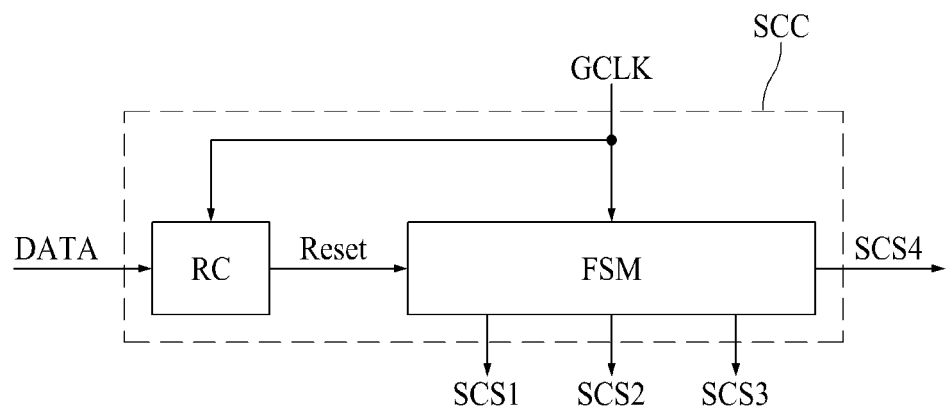
FIG. 5 is a diagram illustrating a switch control circuit illustrated in FIG. 4.

FIG. 5 is a diagram illustrating the switch control circuit illustrated in FIG. 4.

Referring to FIG. 5, the switch control circuit SCC may be connected to the data line DL and the clock line CL and may output the plurality of driving switch control signals SCS1 to SCS3 and the shift switch control signal SCS4. For example, in a case where each of the pixel driving chips 120 sequentially drives the first to third light emitting devices E1 to E3, each of the pixel driving chips 120 may include the first to third pixel driving circuits PC1 to PC3, and the switch control circuit SCC may output the first to third driving switch control signals SCS1 to SCS3 and the shift switch control signal SCS4.

The switch control circuit SCC may include a switch control signal generator FSM and a reset controller RC.

The switch control signal generator FSM may receive the clock signal GCLK through the clock line CL to generate the first to third driving switch control signals SCS1 to SCS3 and the shift switch control signal SCS4. In detail, when the clock signal GCLK is applied through the clock line CL, the switch control signal generator FSM may count the clock signal GCLK. Also, whenever the switch control signal generator FSM counts the clock signal GCLK, the switch control signal generator FSM may sequentially output the first to third driving switch control signals SCS1 to SCS3, and when an output of each of the first to third driving switch control signals SCS1 to SCS3 is completed, the switch control signal generator FSM may output the shift switch control signal SCS4. Therefore, the switch control signal generator FSM may count the clock signal GCLK to output the first to third driving switch control signals SCS1 to SCS3 and the shift switch control signal SCS4, and thus, the gate line and the gate driving circuit for applying the gate pulse through the gate line may not separately be provided.

According to an aspect, when the clock signal GCLK is counted once, the switch control signal generator FSM may output the first driving switch control signal SCS1, and when the clock signal GCLK is counted twice, the switch control signal generator FSM may output the second driving switch control signal SCS2. Also, when the clock signal GCLK is counted three times, the switch control signal generator FSM may output the third driving switch control signal SCS3. Also, when the clock signal GCLK is counted four times, the switch control signal generator FSM may output the shift switch control signal SCS4 to allow the clock signal GCLK to be counted because driving of the first to third light emitting devices E1 to E3 is completed during a unit frame.

The reset controller RC may supply a reset signal Reset to the switch control signal generator FSM. According to an aspect, the switch control signal generator FSM may generate the plurality of driving switch control signals SCS1 to SCS3 and the shift switch control signal SCS4 during a data transmission period, and during a blank period, the reset controller RC may generate the reset signal Reset and may supply the reset signal Reset to the switch control signal generator FSM. In detail, the reset controller RC may generate the reset signal Reset, based on the clock signal GCLK and the data signal DATA received though the data line DL. Here, when driving of all of the light emitting devices E of the display panel 100 is completed during a unit frame, the reset signal Reset may be used for initializing the clock signal GCLK before proceeding to a next unit frame. That is, when driving of all of the light emitting devices E of the display panel 100 is completed during a data transmission period of a unit frame, the reset controller RC may supply the reset signal Reset to the switch control signal generator FSM to initialize the clock signal GCLK during a blank period of the unit frame. In this manner, the initialized clock signal GCLK may be again counted by the switch control signal generator FSM during a next unit frame. Accordingly, since the light emitting display apparatus according to the present disclosure generates the reset signal Reset from only the data signal DATA and the clock signal GCLK even without including a separate pad part for supplying the reset signal, the number of pad parts PP disposed in the display panel 100 may be minimized, and thus, the bezel area of the display panel 100 may be minimized.

According to an aspect, the reset controller RC may further include a digital-analog converter which outputs a driving voltage, based on the data signal DATA. That is, when a digital data signal DATA is applied, the reset controller RC may convert the digital data signal DATA into an analog driving voltage, and may generate the reset signal Reset based on the driving voltage and the clock signal GCLK.

According to an aspect, when the driving voltage determined based on the data signal DATA has a high level at least once while the clock signal GCLK is maintained at a high level in a blank period, the reset controller RC may generate the reset signal Reset. In detail, in order to generate the reset signal Reset from only the data signal DATA and the clock signal GCLK, the reset controller RC may previously determine a condition of generating the reset signal Reset. For example, when the driving voltage determined based on the data signal DATA continuously has a high level twice while the clock signal GCLK is maintained at a high level in a blank period, the reset controller RC may generate the reset signal Reset. Here, the condition of generating the reset signal Reset is not limited to the above-described example and may be freely set based on a combination of the data signal DATA and the clock signal GCLK. As described above, the light emitting display apparatus according to the present disclosure may generate the reset signal Reset from only the data signal DATA and the clock signal GCLK even without including a separate pad part for supplying the reset signal.

Figure 6:
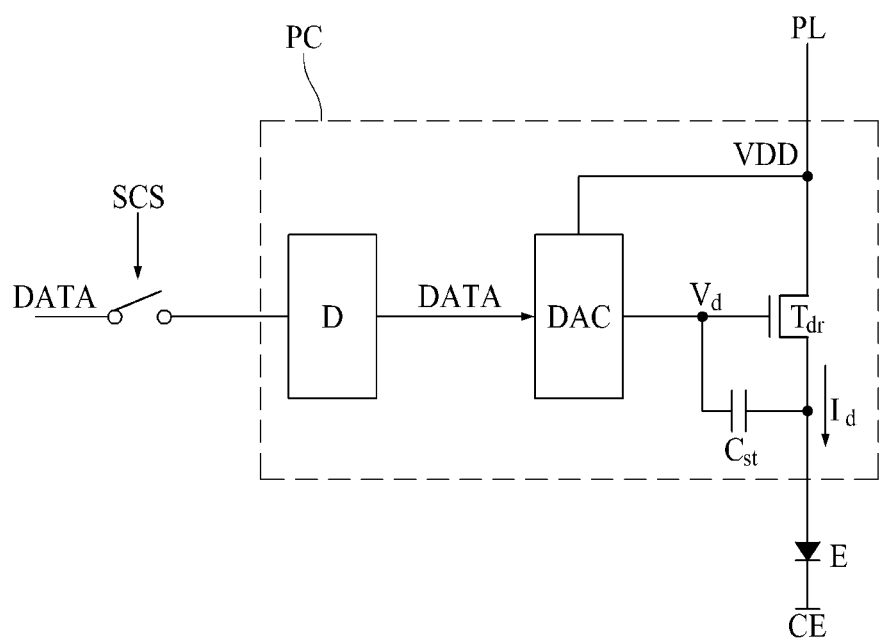
FIG. 6 is a diagram illustrating a pixel driving circuit illustrated in FIG. 4.

FIG. 6 is a diagram illustrating the pixel driving circuit illustrated in FIG. 4.

Referring to FIG. 6, the pixel driving circuit PC may include a decoder D, a digital-analog converter DAC, a capacitor Cst, and a driving transistor Tdr.

The decoder D may be connected to the data line DL and may output the data signal DATA. In detail, the decoder D may receive the data signal DATA through the data line DL, based on the switch control signal SCS and may supply the data signal DATA to the digital-analog converter DAC.

The digital-analog converter DAC may be connected to the decoder D and the pixel driving power line PL and may output a driving voltage Vd. In detail, the digital-analog converter DAC may receive a digital data signal DATA from the decoder D and may receive an analog pixel driving voltage VDD through the pixel driving power line PL, thereby outputting an analog driving voltage Vd. That is, the digital-analog converter DAC may drop the pixel driving voltage VDD to output the driving voltage Vd, based on a digital value of the data signal DATA. In this manner, the digital value of the data signal DATA may be used to determine a luminance of light emitted from each of the plurality of light emitting devices E.

The capacitor Cst may be provided in an overlap area between a gate electrode and a source electrode of the driving transistor Tdr and may store the driving voltage Vd supplied to the gate electrode of the driving transistor Tdr. Also, the capacitor Cst may turn on the driving transistor Tdr with the stored driving voltage Vd.

The driving transistor Tdr may include the gate electrode connected to the digital-analog converter DAC, a drain electrode connected to the pixel driving power line PL to receive the pixel driving voltage VDD, and the source electrode connected to a corresponding light emitting device E. According to an aspect, the driving transistor Tdr may be turned on based on the driving voltage Vd from the digital-analog converter DAC and may control a driving current Id flowing to the corresponding light emitting device E, thereby controlling light emission of the corresponding light emitting device E.

Optionally, the pixel driving circuit PC may further include at least one compensation TFT for compensating for a threshold voltage shift of the driving transistor Tdr, and moreover, may further include at least one auxiliary capacitor. According to an aspect, the pixel driving circuit PC may be additionally supplied with a compensation voltage such as an initialization voltage, based on the number of TFTs and auxiliary capacitors. Therefore, the pixel driving circuit PC may be changed to a pixel driving circuit PC of a well-known light emitting display apparatus which emits light according to a current driving manner, and in this case, each of the plurality of pixel driving chips 120 may further include at least one terminal (or bump), based on the number of TFTs and the number of power sources, and moreover, a power line corresponding to the pixel driving voltage on the substrate 110 may be additionally provided.

Figure 7:
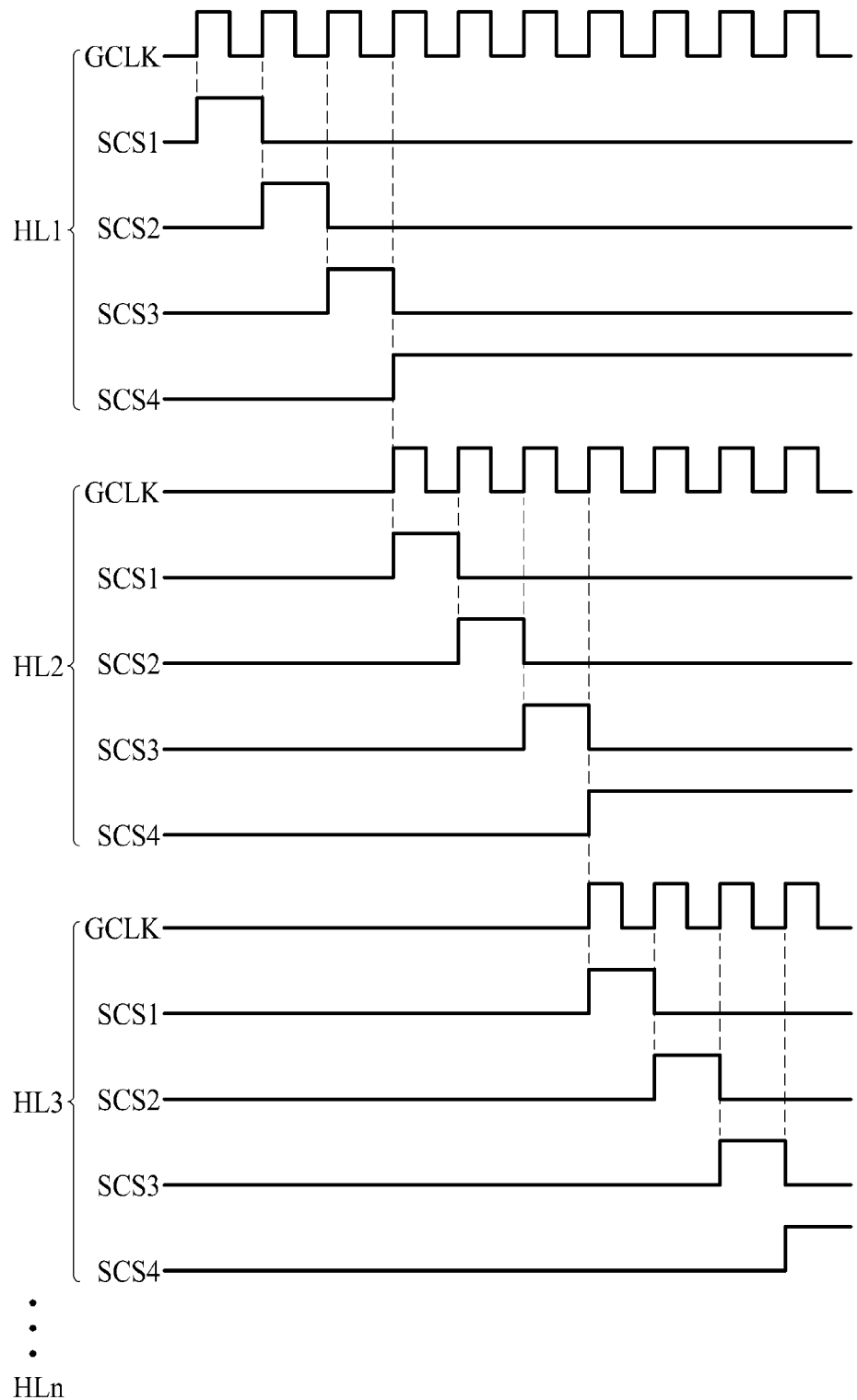
FIG. 7 is a waveform diagram showing a clock signal, a plurality of driving switch control signals, and a shift switch control signal applied to a plurality of pixels arranged along a plurality of horizontal lines in a light emitting display apparatus according to an aspect of the present disclosure.

FIG. 7 is a waveform diagram showing a clock signal, a plurality of driving switch control signals, and a shift switch control signal applied to a plurality of pixels arranged along a plurality of horizontal lines in a light emitting display apparatus according to an aspect of the present disclosure.

Referring to FIG. 7, each of the plurality of pixel driving chips 120 may receive the clock signal GCLK through the clock line CL connected to a pixel driving chip 120 of a front stage pixel P, shift the received clock signal GCLK, and supply the shifted clock signal GCLK to a pixel driving chip 120 of a rear stage pixel P.

According to an aspect, the clock line CL may be first connected to pixel driving chips 120 of pixels P arranged along the first horizontal line HL1 and may be sequentially connected to pixel driving chips 120 of pixels P arranged along the second to $n^{th}$ horizontal line HL2 to HLn. In this manner, whenever the clock line CL passes through pixel driving chips 120 of pixels P arranged along the first to $n^{th}$ horizontal line HL1 to HLn, the clock line CL may transmit a shifted clock signal GCLK to a pixel driving chip 120 of a rear stage pixel P.

According to an aspect, the clock line CL may be first connected to pixel driving chips 120 of pixels P arranged along the first horizontal line HL1 and may transmit an initial clock signal GCLK (or a reference clock) which is not shifted. At this time, pixel driving chips 120 of pixels P arranged along the first horizontal line HL1 may shift an initial clock signal GCLK received through the clock input terminal GCLK_IN and may supply a once-shifted clock signal GCLK to pixel driving chips 120 of pixels P arranged along the second horizontal line HL2 through the clock output terminal GCLK_OUT. Also, the pixel driving chips 120 of the pixels P arranged along the second horizontal line HL2 may shift the once-shifted clock signal GCLK received through a clock input terminal GCLK_IN once more and may supply a twice-shifted clock signal GCLK to pixel driving chips 120 of pixels P arranged along the third horizontal line HL3 through a clock output terminal GCLK_OUT. In this manner, the pixel driving chips 120 of the pixels P arranged along the n-1$^{th}$ horizontal line HLn-1 may supply a (n-1)-times-shifted clock signal GCLK to pixel driving chips 120 of pixels P arranged along the n$^{th}$ horizontal line HLn through the clock line CL.

Here, a period in which a clock signal GCLK is shifted once may be determined based on the number of light emitting devices E which are driven by one pixel driving chip 120 during a unit frame, but is not limited thereto. For example, in a case where one pixel driving chip 120 drives first to third light emitting devices E1 to E3 during a unit frame, the pixel driving chip 120 may shift the clock signal GCLK by three periods and may supply the shifted clock signal GCLK to a pixel driving chip 120 of a rear stage pixel P.

According to an aspect, each of a plurality of switch control circuits SCC may start to output the plurality of driving switch control signals (for example, the first to third driving switch control signals) SCS1 to SCS3 at a time when a switch control circuit SCC of a pixel driving chip 120 of a front stage pixel P outputs the shift switch control signal SCS4. For example, whenever the clock signal GCLK is counted, a switch control circuit SCC of the pixel driving chip 120 of the 1-1$^{th}$ pixel P11 may sequentially output the first to third driving switch control signals SCS1 to SCS3, and when an output of each of the first to third driving switch control signals SCS1 to SCS3 is completed, the switch control circuit SCC may output the shift switch control signal SCS4. At this time, the pixel driving chip 120 of the 2-1$^{th}$ pixel P21 may receive a shifted clock signal GCLK from the pixel driving chip 120 of the 1-1$^{th}$ pixel P11 and may output the first to third driving switch control signals SCS1 to SCS3 to sequentially drive the first to third light emitting devices E1 to E3, based on the shifted clock signal GCLK. In this manner, a switch control circuit SCC of the pixel driving chip 120 of the 2-1$^{th}$ pixel P21 may output the first driving switch control signal SCS1 at a time when the switch control circuit SCC of the pixel driving chip 120 of the 1-1$^{th}$ pixel P11 outputs the shift switch control signal SCS4.

For example, when the clock signal GCLK is counted once, the switch control signal generator FSM may output the first driving switch control signal SCS1, and when the clock signal GCLK is counted twice, the switch control signal generator FSM may output the second driving switch control signal SCS2. Also, when the clock signal GCLK is counted three times, the switch control signal generator FSM may output the third driving switch control signal SCS3. Also, when the clock signal GCLK is counted four times, the switch control signal generator FSM may output the shift switch control signal SCS4 to allow the clock signal GCLK to be counted because driving of the first to third light emitting devices E1 to E3 is completed during a unit frame.

Figure 8:
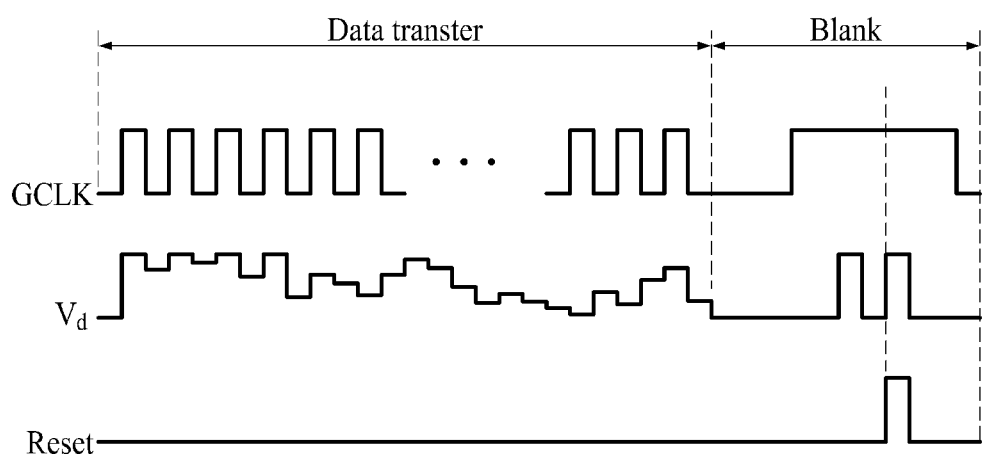
FIG. 8 is a diagram illustrating a reset signal generating method in a light emitting display apparatus according to an aspect of the present disclosure.

FIG. 8 is a diagram illustrating a reset signal generating method in a light emitting display apparatus according to an aspect of the present disclosure.

Referring to FIG. 8, the reset controller RC may supply the reset signal Reset to the switch control signal generator FSM. According to an aspect, the switch control signal generator FSM may generate the plurality of driving switch control signals SCS1 to SCS3 and the shift switch control signal SCS4 during the data transmission period, and during the blank period, the reset controller RC may generate the reset signal Reset and may supply the reset signal Reset to the switch control signal generator FSM. In detail, the reset controller RC may generate the reset signal Reset, based on the clock signal GCLK and the data signal DATA received though the data line DL. Here, when driving of all of the light emitting devices E of the display panel 100 is completed during a unit frame, the reset signal Reset may be used for initializing the clock signal GCLK before proceeding to a next unit frame. That is, when driving of all of the light emitting devices E of the display panel 100 is completed during a data transmission period of a unit frame, the reset controller RC may supply the reset signal Reset to the switch control signal generator FSM to initialize the clock signal GCLK during a blank period of the unit frame. In this manner, the initialized clock signal GCLK may be again counted by the switch control signal generator FSM during a next unit frame.

According to an aspect, when the driving voltage determined based on the data signal DATA has a high level at least once while the clock signal GCLK is maintained at a high level in a blank period, the reset controller RC may generate the reset signal Reset. In detail, in order to generate the reset signal Reset from only the data signal DATA and the clock signal GCLK, the reset controller RC may previously determine a condition of generating the reset signal Reset. For example, when the driving voltage determined based on the data signal DATA continuously has a high level twice while the clock signal GCLK is maintained at a high level in a blank period, the reset controller RC may generate the reset signal Reset. Here, the condition of generating the reset signal Reset is not limited to the above-described example and may be freely set based on a combination of the data signal DATA and the clock signal GCLK. As described above, the light emitting display apparatus according to the present disclosure may generate the reset signal Reset from only the data signal DATA and the clock signal GCLK even without including a separate pad part for supplying the reset signal.

Figure 9:
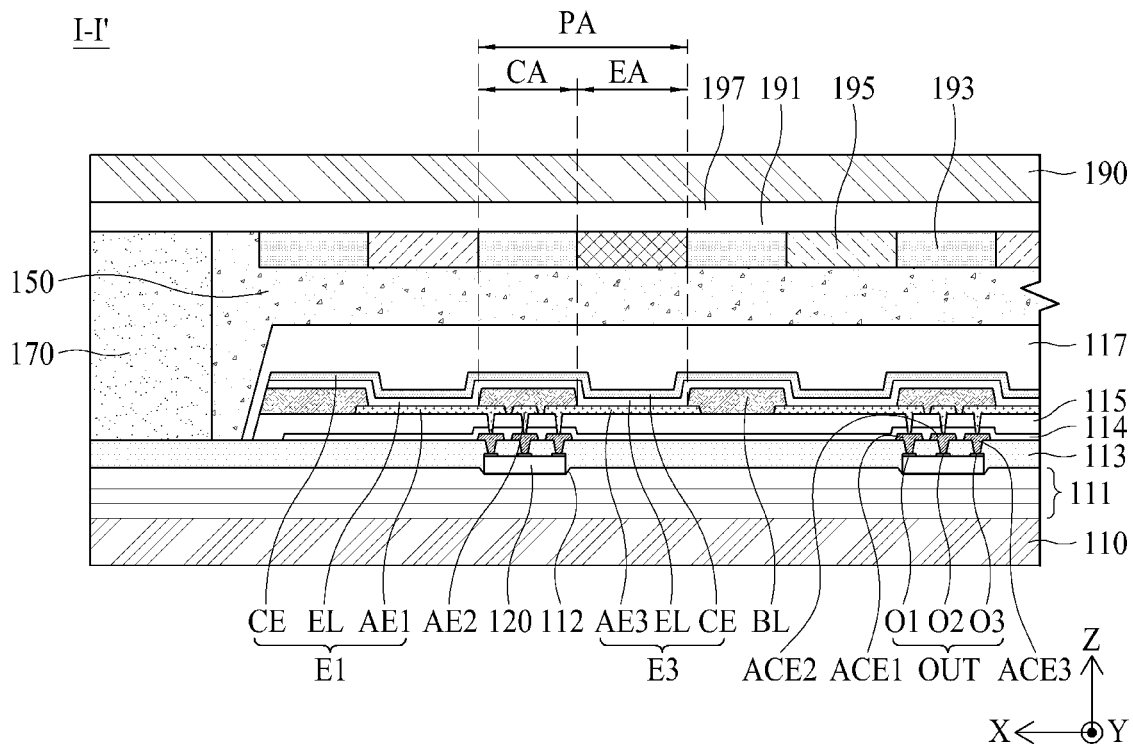
FIG. 9 is a cross-sectional view taken along line I-I' illustrated in FIG. 1.

FIG. 9 is a cross-sectional view taken along line I-I' illustrated in FIG. 1 and is a cross-sectional view illustrating adjacent pixels provided in the display panel illustrated in FIG. 1.

Referring to FIG. 9, a light emitting display apparatus according to an aspect of the present disclosure may include a substrate 110, a buffer layer 111, a pixel driving chip 120, a first planarization layer 113, an insulation layer 114, a second planarization layer 115, an encapsulation layer 117, and a plurality of light emitting devices E.

The substrate 110, a base substrate, may be formed of an insulating material such as glass, quartz, ceramic, or plastic. The substrate 110 may include a plurality of pixel areas PA each including an emitting area EA and a circuit area CA.

The buffer layer 111 may be provided on the substrate 110. The buffer layer 111 may prevent water from penetrating into the plurality of light emitting devices E through the substrate 110. According to an aspect, the buffer layer 111 may include at least one inorganic layer including an inorganic material. For example, the buffer layer 111 may be a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

Each of the plurality of pixel driving chips 120 may be mounted on the buffer layer 111 in the circuit area CA of each of the plurality of pixel areas PA through a chip mounting process. The plurality of pixel driving chips 120 may each have a size of 1 µm to 100 µm, but are not limited thereto. In other aspects, the plurality of pixel driving chips 120 may each have a size which is smaller than that of the emitting area EA other than an area occupied by the circuit area CA among the plurality of pixel areas PA. Each of the plurality of pixel driving chips 120, as described above, may include the switch control circuit SCC and the plurality of pixel driving circuits PC, and thus, its repetitive description will be omitted.

The plurality of pixel driving chips 120 may be attached on the buffer layer 111 by an adhesive layer. Here, the adhesive layer may be provided on a rear surface (or a back surface) of each of the plurality of pixel driving chips 120. For example, in the chip mounting process, a vacuum adsorption nozzle may vacuum-adsorb the plurality of pixel driving chips 120 each including the rear surface (or the back surface) coated with the adhesive layer, and thus, the plurality of pixel driving chips 120 may be mounted on (or transmitted onto) the buffer layer 111 in a corresponding pixel area PA.

Optionally, the plurality of pixel driving chips 120 may be respectively mounted on a plurality of concave portions 112 respectively provided in the circuit areas CA of the plurality of pixel areas PA.

Each of the plurality concave portions 112 may be recessed from a front surface of the buffer layer 111 disposed in a corresponding circuit area CA. For example, each of the plurality of concave portions 112 may have a groove shape or a cup shape which has a certain depth from the front surface of the buffer layer 111. Each of the plurality of concave portions 112 may individually accommodate and fix a corresponding pixel driving chip of the plurality of pixel driving chips 120, thereby minimizing an increase in thickness of the light emitting display apparatus caused by a thickness (or a height) of each of the plurality of pixel driving chips 120. Each of the plurality of concave portions 112 may be concavely formed to have a shape corresponding to the plurality of pixel driving chips 120 and to have an inclined surface inclined at a certain angle, and thus, misalignment between the circuit areas CA and the pixel driving chips 120 is minimized in a mount process of mounting the plurality of pixel driving chips 120 on the buffer layer 111.

The plurality of pixel driving chips 120 according to an aspect may be respectively attached on floors of the plurality of concave portions 112 by the adhesive layer coated on each of the plurality of concave portions 112. According to another aspect, the plurality of pixel driving chips 120 may be respectively attached on the floors of the plurality of concave portions 112 by the adhesive layer coated on a whole surface of the buffer layer 111 including the plurality of concave portions 112.

The first planarization layer 113 may be disposed on a front surface of the substrate 110 and may cover the plurality of pixel driving chips 120. That is, the first planarization layer 113 may cover the buffer layer 111 and the plurality of pixel driving chips 120 disposed on the substrate 110, and thus, may provide a flat surface on the buffer layer 111 and the plurality of pixel driving chips 120 and may fix the plurality of pixel driving chips 120. For example, the first planarization layer 113 may be formed of acryl resin, epoxy resin, phenolic resin, polyamide resin, polyimide resin, and/or the like.

The insulation layer 114 may be disposed on the substrate 110 to cover a plurality of anode connection electrodes (for example, first to third anode connection electrodes) ACE1 to ACE3. For example, the insulation layer 114 may be $SiO_x$, $SiN_x$, SiON, or a multilayer thereof.

The first to third anode connection electrodes ACE1 to ACE3 may respectively connect first to third anode electrodes AE1 to AE3 to first to third output terminals O1 to O3 of a pixel driving chip 120. The first to third anode connection electrodes ACE1 to ACE3 may be provided on the first planarization layer 113 and may be covered by the insulation layer 114.

Each of the first to third anode connection electrodes ACE1 to ACE3 may be formed of molybdenum (Mo), aluminum (Al), chrome (Cr), gold (Au), titanium (Ti), nickel (Ni), neodymium (Nd), copper (Cu), or an alloy thereof and may be formed of a single layer including at least one of the metals or the alloy or a multilayer which includes two or more layers and includes at least one of the metals or the alloy.

The second planarization layer 115 may be disposed on the substrate 110 to cover the insulation layer 114. That is, the second planarization layer 115 may provide a flat surface on the insulation layer 114. For example, the second planarization layer 115 may be formed of acryl resin, epoxy resin, phenolic resin, polyamide resin, polyimide resin, and/or the like, but is not limited thereto.

The encapsulation layer 117 may be disposed on the substrate 110 to cover the plurality of light emitting devices E. According to an aspect, the encapsulation layer 117 may prevent oxygen or water from penetrating into a light emitting layer EL of each of the plurality of light emitting devices E. According to an aspect, the encapsulation layer 117 may include one inorganic material of silicon oxide ($SiO_x$), silicon nitride ($SiN_x$), silicon oxynitride (SiON), titanium oxide ($TiO_x$), and aluminum oxide ($AlO_x$).

Optionally, the encapsulation layer 117 may further include at least one organic layer. The organic layer may be formed to have a sufficient thickness, for preventing particles from penetrating into a light emitting device layer via the encapsulation layer 117. According to an aspect, the organic layer may be formed of one organic material of acryl resin, epoxy resin, phenolic resin, polyamide resin, polyimide resin, benzocyclobutene resin, and fluorine resin.

The plurality of light emitting devices E may each include a plurality of anode electrodes (for example, the first to third anode electrodes) AE1 to AE3, the light emitting layer EL, a cathode electrode CE and a bank layer BL.

Each of the plurality of anode electrodes AE1 to AE3 may be individually patterned in each of the pixel areas PA. Each of the plurality of anode electrodes AE1 to AE3 may be electrically connected to an output terminal OUT of a corresponding pixel driving chip 120 through an anode contact hole provided in the second planarization layer 115 in a corresponding pixel area PA and may be supplied with a data current through the output terminal OUT of the corresponding pixel driving chip 120. According to an aspect, the plurality of anode electrodes AE1 to AE3 may each include a metal material which is high in reflectance. For example, each of the plurality of anode electrodes AE1 to AE3 may be formed in a multilayer structure such as a stacked structure (Ti/Al/Ti) including aluminum (Al) and titanium (Ti), a stacked structure (ITO/Al/ITO) including aluminum (Al) and indium tin oxide (ITO), an APC (Al/Pd/Cu) alloy of Al, palladium (Pd), and Cu, or a stacked structure (ITO/APC/ITO) including an APC alloy and ITO, or may include a single-layer structure including one material or an alloy of two or more materials selected from among silver (Ag), aluminum (Al), molybdenum (Mo), gold (Au), magnesium (Mg), calcium (Ca), and barium (Ba).

The light emitting layer EL may be disposed in an emitting area EA on the plurality of anode electrodes AE1 to AE3.

The light emitting layer EL according to an aspect may include two or more sub light emitting layers for emitting white light. For example, the light emitting layer EL may include a first sub light emitting layer and a second sub light emitting layer for emitting white light based on a combination of first light and second light. Here, the first sub light emitting layer may emit the first light and may include one of a blue light emitting layer, a green light emitting layer, a red light emitting layer, a yellow light emitting layer, and a yellow-green light emitting layer. The second sub light emitting layer may include a light emitting layer, which emits light having a complementary color relationship with the first light, of a blue light emitting layer, a green light emitting layer, a red light emitting layer, a yellow light emitting layer, and a yellow-green light emitting layer. Since the light emitting layer EL emits white light, the light emitting layer EL may be provided on the substrate 110 to cover the plurality of anode electrodes AE1 to AE3 and the bank layer BL without being individually patterned in each pixel area PA.

Additionally, the light emitting layer EL may additionally include one or more function layers for enhancing the emission efficiency and/or lifetime of the light emitting layer EL.

The cathode electrode CE may be disposed to cover the light emitting layer EL. In order for light emitted from the light emitting layer EL to be irradiated onto the opposite substrate 190, the cathode electrode CE according to an aspect may be formed of indium tin oxide (ITO) or indium zinc oxide (IZO), which is a transparent conductive material such as transparent conductive oxide (TCO).

The bank layer BL may define the emitting area EA in each of the plurality of pixel areas PA and may be referred to as a pixel defining layer (or an isolation layer). The bank layer BL may be provided on the second planarization layer 115 and in an edge of each of the plurality of anode electrodes AE and may overlap the circuit area CA of the pixel area PA to define the emitting area EA in each pixel area PA. For example, the bank layer BL may be formed of one organic material of acryl resin, epoxy resin, phenolic resin, polyamide resin, polyimide resin, benzocyclobutene resin, and fluorine resin. As another example, the bank layer BL may be formed of a photosensitive material including a black pigment. In this case, the bank layer BL may act as a light blocking pattern.

The opposite substrate 190 may be defined as a color filter array substrate. The opposite substrate 190 according to an aspect may include a barrier layer 191, a black matrix 193, and a color filter layer 195.

The barrier layer 191 may be provided one whole surface of the opposite substrate 190 facing the substrate 110 and may prevent penetration of external water or moisture. The barrier layer 191 according to an aspect may include at least one inorganic layer including an inorganic material. For example, the barrier layer 191 may be formed of a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The black matrix 193 may be disposed on the barrier layer 191 to overlap the bank layer BL provided on the substrate 110 and may define a plurality of transmissive parts respectively overlapping the emitting areas EA of the plurality of pixel areas PA. The black matrix 193 may be formed of a resin material or an opaque metal material such as chrome Cr or CrOx, or may be formed of a light absorbing material.

The color filter layer 195 may be disposed in each of the plurality of transmissive parts provided by the black matrix 193. The color filter layer 195 may include one of a red color filter, a green color filter, and a blue color filter. The red color filter, the green color filter, and the blue color filter may be repeatedly disposed in a first direction X.

Optionally, the color filter layer 195 may include a quantum dot which has a size enabling light of a predetermined color to be emitted and re-emits light according to light incident from the light emitting layer EL. Here, the quantum dot may include CdS, CdSe, CdTe, ZnS, ZnSe, GaAs, GaP, GaAs—P, Ga—Sb, InAs, InP, InSb, AlAs, AlP, AlSb, and the like. For example, the red color filter may include a quantum dot (for example, CdSe or InP) emitting red light, the green color filter may include a quantum dot (for example, CdZnSeS) emitting green light, and the blue color filter may include a quantum dot (for example, ZnSe) emitting blue light. As described above, when the color filter layer 195 includes a quantum point, a color reproduction rate increases.

The opposite substrate 190 may be opposite-bonded to the substrate 110 by the transparent adhesive layer 150. Here, the transparent adhesive layer 150 may be referred to as a filler. The transparent adhesive layer 150 according to an aspect may be formed of a material capable of being filling between the substrate 110 and the opposite substrate 190, and for example, may be formed of a transparent epoxy material capable of transmitting light, but the present disclosure is not limited thereto. The transparent adhesive layer 150 may be formed on the substrate 110 by a process such as an inkjet process, a slit coating process, or a screen printing process, but is not limited thereto. In other aspects, the transparent adhesive layer 150 may be provided on the opposite substrate 190.

Additionally, the light emitting display apparatus according to an aspect of the present disclosure may further include a dam pattern 170 which surrounds an outer portion of the transparent adhesive layer 150.

The dam pattern 170 may be provided in an edge of the opposite substrate 190 in a closed loop form. The dam pattern 170 according to an aspect may be provided in an edge of the barrier layer 191 provided on the opposite substrate 190 to have a certain height. The dam pattern 170 may block the spread or overflow of the transparent adhesive layer 150 and may bond the substrate 110 to the opposite substrate 190. The dam pattern 170 according to an aspect may be formed of a high-viscosity resin (for example, an epoxy material) capable of being cured by light such as ultraviolet (UV). Furthermore, the dam pattern 170 may be formed of an epoxy material including a getter material capable of adsorbing water and/or oxygen, but is not limited thereto. The dam pattern 170 may block penetration of external water and/or oxygen into a gap between the substrate 110 and the opposite substrate 190 bonded to each other to protect the light emitting layer EL from the external water and/or oxygen, thereby increasing the reliability of the light emitting layer EL and preventing the lifetime of the light emitting layer EL from being reduced by the water and/or oxygen.

Figure 10:
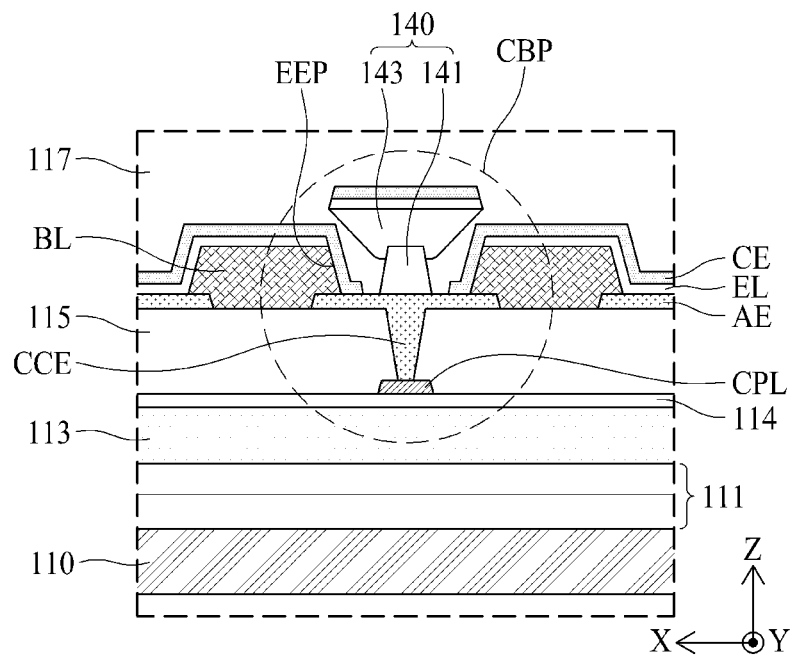
FIG. 10 is a diagram illustrating a connection structure between a cathode electrode and a cathode power supply line in a light emitting display apparatus according to an aspect of the present disclosure.

FIG. 10 is a diagram illustrating a connection structure between a cathode electrode and a cathode power supply line in a light emitting display apparatus according to an aspect of the present disclosure.

Referring to FIG. 10, a substrate 110 according to an aspect of the present disclosure may further include a plurality of cathode power lines which are disposed in parallel on an insulation layer 114 with at least one data line DL therebetween to pass through a display area DA.

The plurality of cathode power lines may receive a cathode voltage (for example, a ground voltage) from the power management circuit 600 through the pad part PP. The plurality of cathode power lines may be electrically connected to a cathode electrode CE in the display area DA. According to an aspect, a bank layer BL may include a plurality of cathode sub-contact parts CBP which are electrically connected to a plurality of cathode power lines CPL and a cathode electrode CE.

The plurality of cathode sub-contact part CBP may include a plurality of cathode connection electrodes CCE and a plurality of electrode exposure parts EEP.

The plurality of cathode connection electrodes CCE may be provided in an island shape on a second planarization layer 115 overlapping the bank layer BL and may be formed of the same material along with the anode electrode AE. An edge, other than a center, of each of the cathode connection electrodes CCE may be surrounded by the bank layer BL and may be spaced apart from and electrically disconnected from an adjacent anode electrode AE. Each of the cathode connection electrodes may be electrically connected to a corresponding cathode power line CPL through a cathode contact hole provided in the second planarization layer 115. In this case, one cathode power line CPL may be electrically connected to at least one cathode connection electrode CCE through at least one cathode contact hole.

The plurality of electrode exposure parts EEP may be disposed on the bank layer BL overlapping the plurality of cathode connection electrodes CCE and may respectively expose the plurality of cathode connection electrodes CCE. Thus, the cathode electrode CE may be electrically connected to each of the plurality of cathode connection electrodes CCE respectively exposed through the plurality of electrode exposure parts EEP and may be electrically connected to each of the plurality of cathode power lines CPL through the plurality of cathode connection electrodes CCE, and thus, may have a relatively low resistance. In particular, the cathode electrode CE may receive the cathode voltage from each of the plurality of cathode power lines CPL through the plurality of cathode connection electrodes CCE, thereby preventing non-uniform luminance caused by the voltage drop (IR drop) of the cathode voltage supplied to the cathode electrode CE.

According to an aspect, the substrate 110 may further include a partition wall part 140.

The partition wall part 140 may include a partition wall supporting part 141 disposed in each of the plurality of cathode connection electrodes CCE and a partition wall 143 disposed on the partition wall supporting part 141.

The partition wall supporting part 141 may be provided in the center of each of the plurality of cathode connection electrodes CCE to have a tapered structure having a trapezoidal cross-sectional surface.

The partition wall 143 may be provided on the partition wall supporting part 141 to have a reverse-tapered structure where a width of a lower surface is narrower than that of an upper surface, and may hide a corresponding electrode exposure part EEP. For example, the partition wall 143 may include a lower surface having a first width supported by the partition wall supporting part 141, an upper surface having a second width which is greater than the first width and is greater than or equal to a width of the electrode exposure part EEP, and an inclined surface which is disposed between the lower surface and the upper surface to hide the electrode exposure part EEP. The upper surface of the partition wall 143 may be provided to cover the electrode exposure part EEP and to one-dimensionally have a size which is greater than or equal to that of the electrode exposure part EEP, and thus, a light emitting material may be prevented from penetrating into the cathode connection electrode CCE exposed at the electrode exposure part EEP in a process of depositing the light emitting layer EL, whereby a cathode electrode material may be electrically connected to the cathode connection electrode CCE exposed at the electrode exposure part EEP in the process of depositing the light emitting layer EL. A penetration space (or a void) may be provided between the inclined surface of the partition wall 143 and the cathode connection electrode CCE exposed at the electrode exposure part EEP, and the edge of the cathode electrode CE may be electrically connected to the cathode connection electrode CCE exposed at the electrode exposure part EEP through the penetration space.

Figure 11:
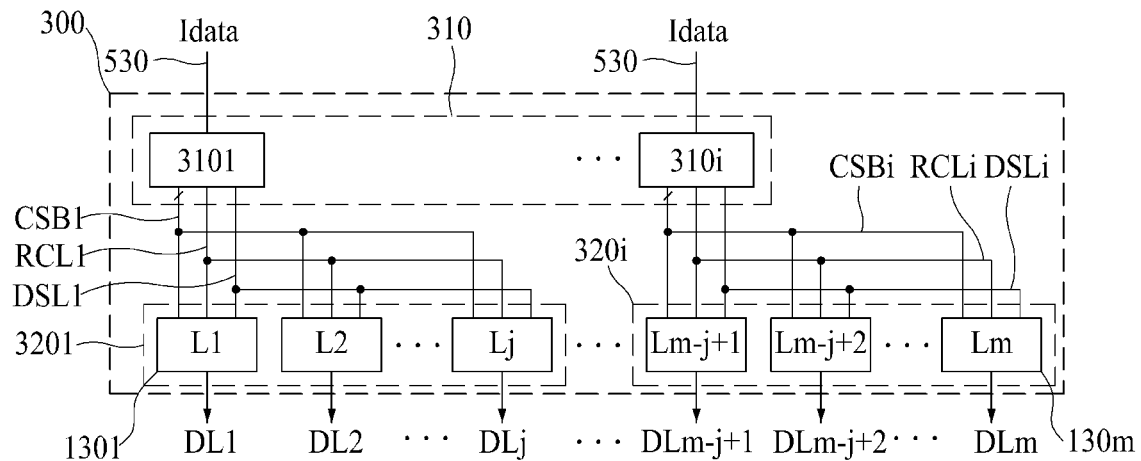
FIG. 11 is a diagram illustrating a data driving chip array part illustrated in FIG. 2.

FIG. 11 is a diagram illustrating the data driving chip array part 300 illustrated in FIG. 2.

Referring to FIG. 11 in conjunction with FIGS. 1 and 2, the data driving chip array part 300 may include a data reception chip array 310 and first to $m^{th}$ data latch chips L1 to Lm. Here, each of the first to $m^{th}$ data latch chips L1 to Lm may be a minimum-unit microchip or one chipset and may be a semiconductor packaging device which includes an integrated circuit (IC) including a plurality of transistors and has a fine size.

The data reception chip array 310 may receive an input digital data signal Idata and may output pixel data for at least one horizontal line. The data reception chip array 310 may receive a digital data signal corresponding to a differential signal transmitted from the timing controller 500 according to a high-speed serial interface manner, for example, an embedded point to point interface (EPI) manner, a low-voltage differential signaling (LVDS) interface manner, or a Mini LVDS interface manner, may generate at least one horizontal line unit of pixel data on the basis of the received digital data signal, and may generate a reference clock and a data start signal from the differential signal.

According to an aspect, the data reception chip array 310 may include first to $i^{th}$ data reception chips 3101 to 310$i$ (here, i is a natural number greater than or equal to two). Here, each of the first to $i^{th}$ data reception chips 3101 to 310$i$ may be a minimum-unit microchip or one chipset and may be a semiconductor packaging device which includes an IC including a plurality of transistors and has a fine size.

Each of the first to $i^{th}$ data reception chips 3101 to 310$i$ may individually receive digital data signals to be supplied to j pixels (where j is a natural number of 2 or greater) among differential signals transmitted from the timing controller 500 through a single interface cable 530, individually generate pixel data to be supplied to the j pixels on the basis of the received digital data signals, and individually generate a reference clock and a data start signal from the differential signals. For example, when the interface cable 530 has first to $i^{th}$ pairs, the first data reception chip 3101 may individually receive digital data signals corresponding to first to $i^{th}$ pixels from the differential signals transmitted from the timing controller 500 through the first pair of the interface cable 530, individually generate pixel data corresponding to the first to $j^{th}$ pixels on the basis of the received digital data signals, and individually generate a reference clock and a data start signal from the differential signals. Also, the $i^{th}$ data reception chip 310$i$ may individually receive digital data signals corresponding to m−j+1$^{th}$ to m$^{th}$ pixels from the differential signals transmitted from the timing controller 500 through the $i^{th}$ pair of the interface cable 530, individually generate pixel data corresponding to the m−j+1$^{th}$ to m$^{th}$ pixels on the basis of the received digital data signals, and individually generate a reference clock and a data start signal from the differential signals.

The first to $i^{th}$ data reception chips 3101 to 310$i$ may individually output pixel data through a serial data communication manner using first to $i^{th}$ common serial data buses CSB1 to CSBi each having a data bus corresponding to the number of bits of the pixel data, individually output the reference clock to first to $i^{th}$ common reference clock lines RCL1 to RCLi, and individually output the data start signal to first to $i^{th}$ data start signal lines DSL1 to DSLi. For example, the first data reception chip 3101 may transmit corresponding pixel data, a corresponding reference clock, and a corresponding data start signal through the first common serial data bus CSB1, the first common reference clock line RCL1, and the first data start signal line DSL1. Also, the $i^{th}$ data reception chip 310$i$ may transmit corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

According to an aspect, the data reception chip array 310 may be configured with only one data reception chip. That is, the first to $i^{th}$ data reception chips 3101 to 310$i$ may be integrated into a single integrated data reception chip.

Each of the first to m$^{th}$ data latch chips L1 to Lm may sample and latch (or hold) pixel data transmitted from the data reception chip array 310 according to the reference clock on the basis of the data start signal, and may output the received reference clock and the latched pixel data through a serial data communication manner.

The first to m$^{th}$ data latch chips L1 to Lm may be grouped into first to $i^{th}$ data latch groups 3201 to 320$i$, each of which consists of j data latch chips.

On a group basis, the data latch chips grouped into the first to $i^{th}$ data latch groups 3201 to 320$i$ may be connected to the first to $i^{th}$ common serial data buses CSB1 to CSBi in common. For example, each of the first to $j^{th}$ data latch chips L1 to Lj grouped into the first data latch group 3201 may receive corresponding pixel data, a corresponding reference clock, and a corresponding start signal through the first common serial data bus CSB1, the first common reference clock line RCL1, and the first data start signal line DSL1. Also, each of m−j+1$^{th}$ to m$^{th}$ data latch chips Lm−j+1 to Lm grouped into the $i^{th}$ data latch group 320$i$ may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to m$^{th}$ data latch chips L1 to Lm may output the received reference clock and the latched pixel data through a serial data communication manner.

According to an aspect, each of the first to m$^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

Additionally, one data reception chip, one data latch chip, and one digital-to-analog conversion chip for supplying data voltage to one data line may configure each of the data driving chip groups 1301 to 130$m$, which may be configured as a single data driving chip. In this case, the number of chips connected to each of the first to m$^{th}$ data lines DL1 to DLm may decrease by a factor of ⅓.

The data driving chip array part 300 may be mounted in the non-display area of the substrate to covert digital data input from the outside into a data voltage and supply the data voltage to the first to m$^{th}$ data lines DL1 to DLm. Accordingly, it is possible to omit a source printed circuit board and flexible circuit films provided in the display apparatus and thus to simplify the configuration of the display apparatus. Therefore, in the light emitting display apparatus according to the present disclosure, an area occupied by the data driving chip array part 300 in the non-display area of the substrate may be reduced, thereby minimizing an increase in bezel width of the display apparatus caused by mounting the data driving chip array part 300 on the substrate.

Figure 12:
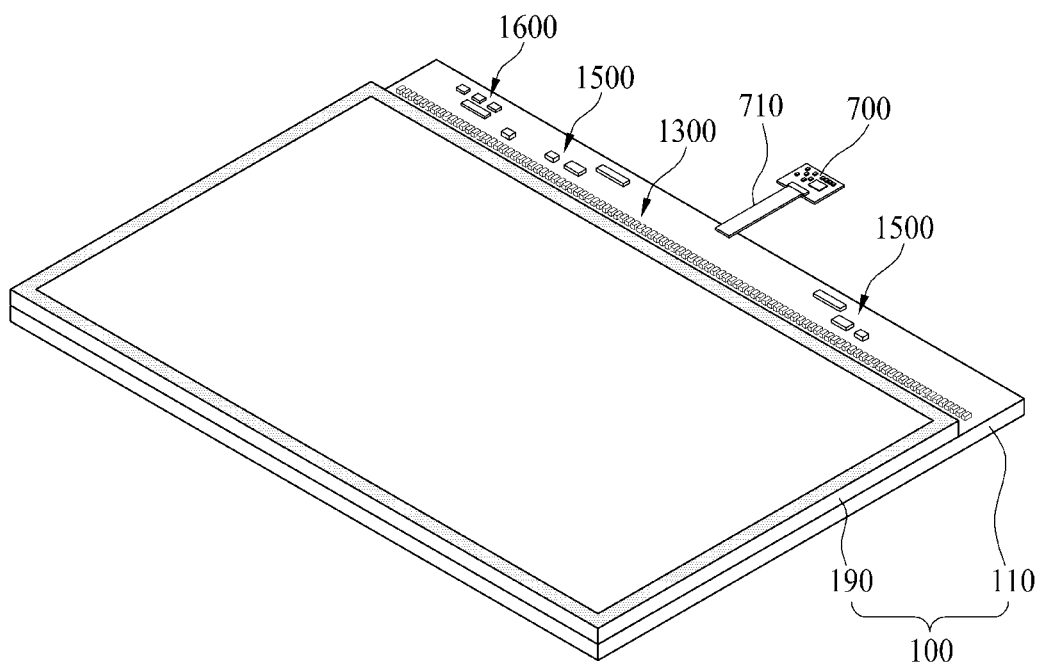
FIG. 12 is a diagram illustrating a light emitting display apparatus according to another aspect of the present disclosure.
Figure 13:
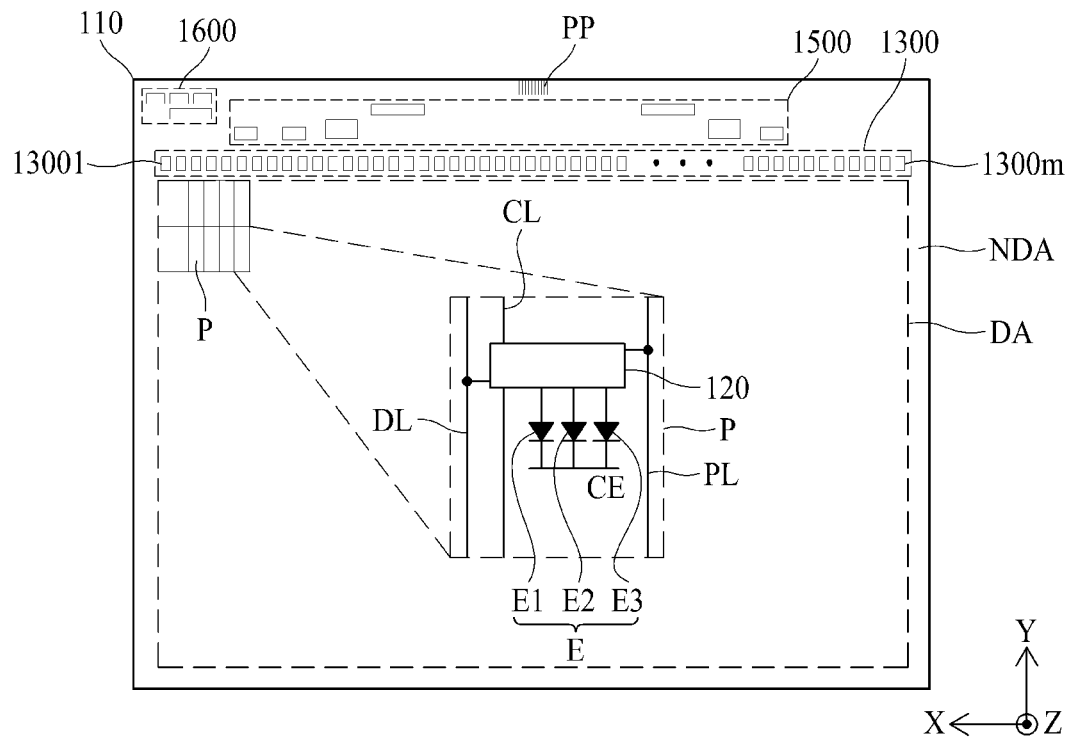
FIG. 13 is a plan view illustrating a substrate illustrated in FIG. 12.

FIG. 12 is a diagram illustrating a light emitting display apparatus according to another aspect of the present disclosure, and FIG. 13 is a plan view illustrating a substrate illustrated in FIG. 12. FIGS. 12 and 13 illustrate an example where each of the timing controller and the power management circuit of the light emitting display apparatus illustrated in FIGS. 1 to 11 is implemented as a microchip, and the microchip is mounted on a substrate of a display panel.

Referring to FIGS. 12 and 13, the light emitting display apparatus according to another aspect of the present disclosure may include a display panel 100, a data driving chip array part 1300, a timing controller chip array part 1500, and a power management chip array part 1600.

The display panel 100 may include a substrate 110 and an opposite substrate 190 and is the same as the display panel of the light emitting display apparatus according to an aspect of the present disclosure. Thus, like reference numerals refer to like elements, and repetitive descriptions of the same elements will be omitted.

The data driving chip array part 1300 may be mounted in a first non-display area (or an upper non-display area) of the substrate 110 and may convert pixel data, supplied from the timing controller chip array part 1500, into a data voltage to supply the data voltage to a corresponding one of first to m$^{th}$ data lines DL. For example, the data driving chip array part 1300 may include a plurality of data driving chips mounted in the first non-display area which is defined between the display area DA and a pad part PP of the substrate 110, and may supply a corresponding data voltage to each of the first to m$^{th}$ data lines DL.

The timing controller chip array part 1500 may be mounted in the first non-display area. The timing controller chip array part 1500 may generate a digital data signal on the basis of an image signal (or a differential signal) supplied from the display driving system 700 through the pad part PP and may provide the digital data signal to the data driving chip array part 1300. That is, the timing controller chip array part 1500 may receive the differential signal input through the pad part PP and may generate a frame-based digital data signal, reference clock, and data start signal from the differential signal. Also, the timing controller chip array part 1500 may perform image processing for image quality improvement on the digital data signal in units of frames and may provide the frame-based digital data signal, on which the image processing has been performed, to the data driving chip array part 1300 in units of at least one horizontal line.

The power management chip array part 1600 may be mounted in the non-display area of the substrate 110 and may output various voltages for displaying an image on each pixel P of the display panel 100 on the basis of an input power supplied from the display driving system 700 through the pad part PP disposed in the substrate 110. According to an aspect, the power management chip array part 1600 may generate a transistor logic voltage, pixel driving power, cathode power, and at least one reference gamma voltage on the basis of the input power.

Figure 14:
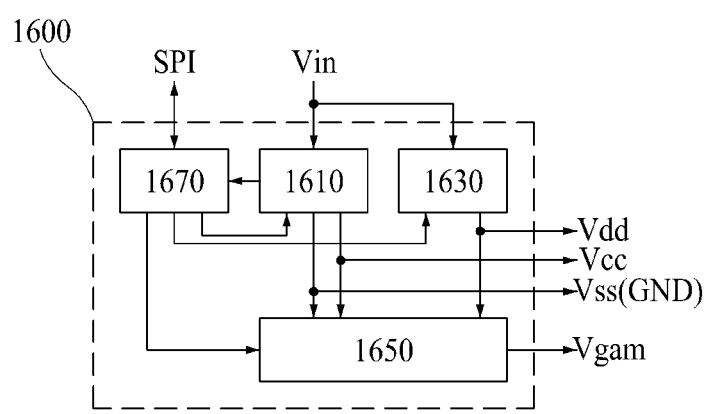
FIG. 14 is a block diagram illustrating a power management chip array part illustrated in FIGS. 12 and 13.

FIG. 14 is a block diagram illustrating the power management chip array part illustrated in FIGS. 12 and 13.

Referring to FIG. 14 in conjunction with FIGS. 12 and 13, the power management chip array part 1600 of the light emitting display apparatus may include a dc-dc converter chip array part which is mounted in the non-display area NDA of the substrate 110 and performs dc-dc conversion on an input power Vin received from the outside to output a converted input power.

The dc-dc converter chip array part may include a logic power chip 1610, a driving power chip 1630, and a gamma voltage generating chip 1650. Here, each of the logic power chip 1610, the driving power chip 1630, and the gamma voltage generating chip 1650 may be a minimum-unit microchip or one chipset and may be a semiconductor packaging device which includes an IC including a plurality of transistors and has a fine size.

The logic power chip 1610 may generate a transistor logic voltage Vcc based on the input power Vin and may provide the transistor logic voltage Vcc to a microchip that requires the transistor logic voltage Vcc. For example, the logic power chip 1610 may decrease (step down) the input power Vin to generate a transistor logic voltage Vcc of 3.3V. Also, the logic power chip 1610 may generate a ground voltage GND based on the input power Vin and provides the ground voltage GND to a microchip that requires the ground voltage GND. Here, the ground voltage GND may be used as cathode power Vss supplied to the cathode electrode CE disposed on the display panel 100. According to an aspect, the logic power chip 1610 may be a dc-dc converter, for example, a step-down converter chip or a buck converter chip, but the present disclosure is not limited thereto.

The driving power chip 1630 may generate pixel driving power VDD based on the input power Vin and may provide the pixel driving power VDD to each pixel P and a microchip that require the pixel driving power VDD. For example, the driving power chip 1630 may generate pixel driving power VDD of 12V. According to an aspect, the driving power chip 1630 may be a dc-dc converter, for example, a step-up converter chip or a boost converter chip, but the present disclosure is not limited thereto.

The gamma voltage generating chip 1650 may receive the transistor logic voltage Vcc from the logic power chip 1610, receive the pixel driving power VDD from the driving power chip 1630, generate at least one reference voltage Vgam, and provide the reference gamma voltage Vgam to the data driving chip array part 1300. For example, through voltage distribution using a plurality of voltage divider resistors connected in series between a low potential terminal to which the transistor logic voltage Vcc is to be supplied and a high potential terminal to which the pixel drive power supply VDD is to be supplied, the gamma voltage generating chip 1650 may output, as the reference gamma voltage Vgam, a distribution voltage of a voltage distribution node between the plurality of voltage divider resistors.

According to an aspect, the power management chip array part 1600 may further include a serial communication chip 1670. Here, the serial communication chip 1670 may be a minimum-unit microchip or one chipset and may be a semiconductor packaging device which includes an IC including a plurality of transistors and has a fine size.

The serial communication chip 1670 may be connected to the display driving system 700 through a connector attached to a serial communication pad disposed at a side of the non-display area of the substrate 110, separately from the pad part PP disposed on the substrate 110. The serial communication chip 1670 may receive a voltage tuning signal supplied from the display driving system 700, restore the received voltage tuning signal back to voltage tuning data, and transmit the voltage tuning data to the dc-dc converter chip array part. For example, the voltage tuning signal may be a signal for tuning a gamma voltage. In this case, the voltage tuning data corresponding to the voltage tuning signal may be provided to the gamma voltage generating chip 1650, and the gamma voltage generating chip 1650 may tune a voltage level of the pixel driving power VDD supplied to the high potential terminal or tune resistance of at least one of the plurality of voltage divider resistors depending on the voltage tuning data.

Figure 15:
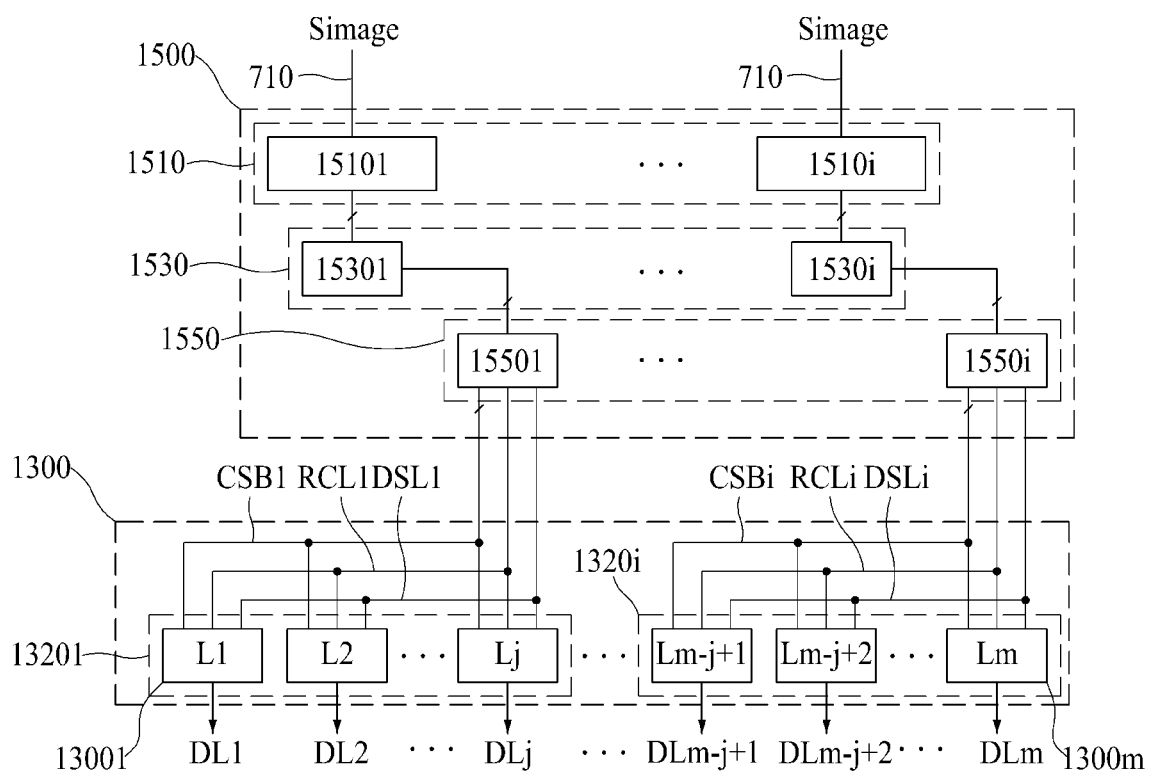
FIG. 15 is a diagram illustrating a timing controller chip array part and a data driving chip array part illustrated in FIGS. 12 and 13.

FIG. 15 is a diagram illustrating the timing controller chip array part and the data driving chip array part illustrated in FIGS. 12 and 13.

Referring to FIG. 15 in conjunction with FIGS. 12 and 13, the timing controller chip array part 1500 of the light emitting display apparatus may include an image signal reception chip array 1510, an image quality improvement chip array 1530, a data control chip array 1550, and a gate control chip 1570.

The image signal reception chip array 1510 may generate a digital data signal, a reference clock, and a data start signal in one frame on the basis of an image signal Simage input from the display driving system 700 through the pad part PP. Here, the image signal Simage may be provided to the image signal reception chip array 1510 through a high-speed serial interface manner, for example, a V-by-One interface manner. In this case, the image signal reception chip array 1510 may receive a digital data signal corresponding to a differential signal for the image signal input from the display driving system 700 through the V-by-One interface manner, generate pixel data corresponding to at least one horizontal line on the basis of the received digital data signal, and generate a reference clock and a data start signal from the differential signal.

According to an aspect, the image signal reception chip array 1510 may include first to $i^{th}$ image signal reception chips 15101 to 1510$i$ (here, i is a natural number greater than or equal to two). Here, each of the first to $i^{th}$ image signal reception chips 15101 to 1510$i$ may be a minimum-unit microchip or one chipset and may be a semiconductor packaging device which includes an IC including a plurality of transistors and has a fine size.

In order to perform synchronization and data communication between the first to $i^{th}$ image signal reception chips 15101 to 1510$i$, the first image signal reception chip 15101 may be programmed as a master to control overall operations and functions in the image signal reception chip array 1510, and each of the second to $i^{th}$ image signal reception chips 15102 to 1510i may be programmed as a slave to operate in synchronization with the first image signal reception chip 15101.

Each of the first to $i^{th}$ image signal reception chips 15101 to 1510i may individually receive digital data signals to be supplied to j pixels among differential signals for the image signal Simage transmitted from the display driving system 700 through an interface cable 710, individually generate pixel data to be supplied to the j pixels on the basis of the received digital data signals, and individually generate a reference clock and a data start signal from the differential signals for the image signal Simage. For example, when the interface cable 710 has first to $i^{th}$ lanes, the first image signal reception chip 15101 may individually receive digital data signals corresponding to first to $i^{th}$ pixels from the differential signals for the image signal S image transmitted from the display driving system 700 through the first lane of the interface cable 710, individually generate pixel data corresponding to the first to $j^{th}$ pixels on the basis of the received digital data signals, and individually generate a reference clock and a data start signal from the differential signals for the image signal Simage. Also, the $i^{th}$ image signal reception chip 1510i may individually receive digital data signals corresponding to m−j+1$^{th}$ to m$^{th}$ pixels from the differential signals for the image signal Simage transmitted from the display driving system 700 through the $i^{th}$ lane of the interface cable 710, individually generate pixel data corresponding to the m−j+1$^{th}$ to m$^{th}$ pixels on the basis of the received digital data signals, and individually generate a reference clock and a data start signal from the differential signals for the image signal Simage.

Each of the first to $i^{th}$ image signal reception chips 15101 to 1510i may generate display setting data for the timing controller chip array part 1500 from a differential signal of a first frame input through the interface cable 710, store the display setting data in an internal memory, and generate a digital data signal, a reference clock, and a data start signal from differential signals for frames that are sequentially input through the interface cable 710.

According to an aspect, the image signal reception chip array 1510 may be configured with only one image signal reception chip. That is, the first to $i^{th}$ image signal reception chips 15101 to 1510i may be integrated into a single integrated image signal reception chip.

The image quality improvement chip array 1530 may receive a frame-based digital data signal from the image signal reception chip array 1510 and may execute a predetermined image quality improvement algorithm to improve the quality of an image corresponding to the frame-based digital data signal.

According to an aspect, the image quality improvement chip array 1530 may include first to $i^{th}$ image quality improvement chips 15301 to 1530i connected on a one-to-one basis to the first to $i^{th}$ image signal reception chips 15101 to 1510i. The first to $i^{th}$ image quality improvement chips 15301 to 1530i may receive digital data signals from the image signal reception chips 15101 to 1510i and may execute the predetermined image quality improvement algorithm to improve image quality according to the frame-based digital data signal. Here, each of the first to $i^{th}$ image quality improvement chips 15301 to 1530i may be a minimum-unit microchip or one chipset and may be a semiconductor packaging device which includes an IC including a plurality of transistors and has a fine size.

In order to perform synchronization and data communication between the first to $i^{th}$ image quality improvement chips 15301 to 1530i, the first image quality improvement chip 15301 may be programmed as a master to control overall operations and functions in the image quality improvement chip array 1530, and each of the second to $i^{th}$ image quality improvement chips 15302 to 1530i may be programmed as a slave to operate in synchronization with the first image quality improvement chip 15301.

When the image signal reception chip array 1510 is configured as a single integrated data reception chip, the first to $i^{th}$ image quality improvement chips 15301 to 1530i may be integrated into a single integrated image quality improvement chip connected to the integrated data reception chip.

On the basis of the reference clock and the data start signal provided from the image signal reception chip array 1510, the data control chip array 1550 may align a digital data signal with image quality improved by the image quality improvement chip array 1530 to generate and output pixel data corresponding to one horizontal line.

According to an aspect, the data control chip array 1550 may include first to $i^{th}$ data control chips 15501 to 1550i connected on a one-to-one basis to the first to $i^{th}$ image quality improvement chips 15301 to 1530i. The first to $i^{th}$ data control chips 15501 to 1550i may receive the digital data signal with improved image quality from the image quality improvement chips 15301 to 1530i and may align the digital data signal to generate and output pixel data, based on the reference clock and the data start signal provided from the image signal reception chip array 1510. Here, each of the first to $i^{th}$ data control chips 15501 to 1550i may be a minimum-unit microchip or one chipset and may be a semiconductor packaging device which includes an IC including a plurality of transistors and has a fine size.

In order to perform synchronization and data communication between the first to $i^{th}$ data control chips 15501 to 1550i, the first data control chip 15501 may be programmed as a master to control overall operations and functions in the data control chip array 1550, and each of the second to $i^{th}$ data control chips 15502 to 1550i may be programmed as a slave to operate in synchronization with the first data control chip 15501.

The first to $i^{th}$ data reception chips 15501 to 1550i may individually output pixel data through a serial data communication manner using first to $i^{th}$ common serial data buses CSB1 to CSBi each having a data bus corresponding to the number of bits of the pixel data, individually output the reference clock to first to $i^{th}$ common reference clock lines RCL1 to RCLi, and individually output the data start signal to first to $i^{th}$ data start signal lines DSL1 to DSLi. For example, the first image signal reception chip 15101 may transmit corresponding pixel data, a corresponding reference clock, and a corresponding data start signal through the first common serial data bus CSB1, the first common reference clock line RCL1, and the first data start signal line DSL1. Also, the $i^{th}$ image signal reception chip 1510i may transmit corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When the image signal reception chip array 1510 is configured as a single integrated data reception chip and the image quality improvement chip array 1530 is configured as a single integrated image quality improvement chip, the first to $i^{th}$ data control chips 15501 to 1550i may be integrated into a single integrated data control chip connected to the integrated data reception chip.

As described above, since the timing controller chip array part 1500 is mounted on the substrate 110 of the display panel 100 and is connected to the display driving system 700 through a single interface cable 710, a connection structure between the display panel 100 and the display driving system 700 may be simplified.

According to an aspect, the data driving chip array part 1300 of the light emitting display apparatus may include first to $m^{th}$ data latch chips L1 to Lm. Here, each of the first to $m^{th}$ data latch chips L1 to Lm may be a minimum-unit microchip or one chipset and may be a semiconductor packaging device which includes an IC including a plurality of transistors and has a fine size.

Each of the first to $m^{th}$ data latch chips L1 to Lm may sample and latch (or hold) pixel data transmitted from the data control chip array 1550 of the timing controller chip array part 1500 according to the reference clock on the basis of the data start signal, and may output the received reference clock and the latched pixel data through a serial data communication manner.

The first to $m^{th}$ data latch chips L1 to Lm may be grouped into first to $i^{th}$ data latch groups 13201 to 1320i, each of which consists of j data latch chips. On a group basis, the first to $i^{th}$ data latch groups 13201 to 1320i may be connected on a one-to-one basis to the first to $i^{th}$ data control chips 15501 to 1550i.

On a group basis, the data latch chips grouped into the first to $i^{th}$ data latch groups 13201 to 1320i may be connected to the first to $i^{th}$ common serial data buses CSB1 to CSB2 in common. For example, each of the first to $j^{th}$ data latch chips L1 to Lj grouped into the first data latch group 13201 may receive corresponding pixel data, a corresponding reference clock, and a corresponding start signal through the first common serial data bus CSB1, the first common reference clock line RCL1, and the first data start signal line DSL1. Also, each of m−j+1$^{th}$ to $m^{th}$ data latch chips Lm−j+1 to Lm grouped into the $i^{th}$ data latch group 1320i may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to $m^{th}$ data latch chips L1 to Lm may output the received reference clock and the latched pixel data through a serial data communication manner.

According to an aspect, each of the first to $m^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

Additionally, one data latch chip, one digital-to-analog conversion chip, and one data amp chip for supplying a data voltage to one data line may configure each of the data driving chip groups 13001 to 1300m capable of being integrated into a single data driving chip. In this case, the number of chips connected to each of the first to $m^{th}$ data lines DL1 to DLm may decrease by a factor of ⅓.

In the light emitting display apparatus according to another aspect, all circuits for allowing the display panel 100 to display an image corresponding to an image signal supplied from the display driving system 700 may be implemented as microchips mounted on the substrate 110, thereby obtaining the same effect as that of the light emitting display apparatus illustrated in FIGS. 1 to 11. Also, the microchips may be more easily simplified and integrated, and since the light emitting display apparatus is directly connected to the display driving system 700 through only one signal cable 710 or two signal cables, a connection structure between the light emitting display apparatus and the display driving system 700 may be simplified. Accordingly, the light emitting display apparatus according to another aspect may have a single plate shape, and thus, may have an enhanced sense of beauty in design.

As described above, since the light emitting display apparatus according to the aspects of the present disclosure includes the plurality of pixel driving chips connected to one another in cascade by the clock line, the gate driving circuit and the gate line connected to the gate driving circuit may be removed from the one end of the display panel and omitted, thereby minimizing the number of pad parts disposed in the display panel.

Moreover, since the light emitting display apparatus according to the aspects of the present disclosure includes the plurality of pixel driving chips cascade-connected to one another by the clock line, the number of pad parts disposed in the display panel may be minimized, thereby minimizing the bezel area of the display panel.

Moreover, in the light emitting display apparatus according to the aspects of the present disclosure, the clock signal received from a pixel driving chip of a front stage pixel may be shifted and supplied to a pixel driving chip of a rear stage pixel, and thus, the plurality of light emitting devices respectively provided in the plurality of pixels may be time-divisionally driven even without the gate driving circuit and the gate line.

Moreover, in the light emitting display apparatus according to the aspects of the present disclosure, without a separate gate driving chip, the plurality of pixels may be driven through only the clock line connecting the data driving chip to the plurality of pixels in cascade, and thus, the manufacturing cost of the light emitting display apparatus may be reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
   a plurality of pixels disposed in a display area of a substrate and each pixel connected to a data line, a clock line and a pixel driving power line,
   wherein each pixel includes:
   a pixel driving chip each connected to the data line, the clock line, and the pixel driving power line sequentially outputting a driving current through a plurality of output terminals of the pixel driving chip; and
   a plurality of light emitting devices respectively connected to the plurality of output terminals,
   wherein the pixel driving chip of each of the plurality of pixels arranged on a first horizontal line of first to $n^{th}$ horizontal lines is connected in parallel to the clock line, and the pixel driving chip of each of the plurality of pixels arranged on the first to $n^{th}$ horizontal lines along the direction parallel to the data line is cascade-connected to one another by the clock line, where n is a natural number equal to or greater than three, and
   wherein the pixel driving chip comprises:
   a switch control circuit connected to the data line and the clock line to output a plurality of driving switch control signals and a shift switch control signal; and a plurality of pixel driving circuits respectively corresponding to the plurality of driving switch control signals.

2. The light emitting display apparatus of claim 1, wherein the plurality of pixel driving chips receives a clock signal through the clock line connected to a pixel driving chip of a front stage pixel, shifts the received clock signal, and supplies the shifted clock signal to a pixel driving chip of a next stage pixel.

3. The light emitting display apparatus of claim 1, wherein the clock line is first connected to pixel driving chips of pixels arranged along the first horizontal line and are sequentially connected to pixel driving chips of pixels arranged along second to $n^{th}$ horizontal lines.

4. The light emitting display apparatus of claim 3, wherein pixel driving chips of pixels arranged along the $n-1^{th}$ horizontal line respectively supply, through the clock line, an (n−1)-times-shifted clock signal to pixel driving chips of pixels arranged along the $n^{th}$ horizontal line.

5. The light emitting display apparatus of claim 1, wherein the plurality of light emitting devices respectively and sequentially receive the driving current from the plurality of pixel driving circuits to emit light of different colors during a unit frame.

6. The light emitting display apparatus of claim 1, wherein the switch control circuit sequentially outputs the plurality of driving switch control signals and outputs the shift switch control signal.

7. The light emitting display apparatus of claim 1, wherein the switch control circuit starts to output the plurality of driving switch control signals at a time when a switch control circuit of a pixel driving chip of a front stage pixel outputs the shift switch control signal.

8. The light emitting display apparatus of claim 1, wherein each of the plurality of pixel driving circuits receives a data signal through the data line based on a corresponding driving switch control signal to output the driving current.

9. The light emitting display apparatus of claim 1, wherein the switch control circuit comprises:
   a switch control signal generator receiving a clock signal through the clock line to generate the plurality of driving switch control signals and the shift switch control signal; and
   a reset controller supplying a reset signal to the switch control signal generator.

10. The light emitting display apparatus of claim 9, wherein the reset controller generates the reset signal, based on a data signal received through the data line and the clock signal.

11. The light emitting display apparatus of claim 10, wherein,
   during a data transmission period, the switch control signal generator generates the plurality of driving switch control signals and the shift switch control signal, and
   during a blank period, the reset controller generates the reset signal and supplies the rest signal to the switch control signal generator.

12. The light emitting display apparatus of claim 11, wherein, when a driving voltage determined based on the data signal has a high level at least once while the clock signal is maintained at a high level in the blank period, the reset controller generates the reset signal.

13. The light emitting display apparatus of claim 1, wherein the plurality of pixel driving circuits each comprise:
   a decoder connected to the data line to output a data signal;
   a digital-analog converter connected to the decoder and the pixel driving power line to output a driving voltage;
   a capacitor storing the driving voltage; and
   a driving transistor turned on based on the driving voltage.

14. The light emitting display apparatus of claim 1, wherein the pixel driving chip of each of the plurality of pixels arranged on the first horizontal line commonly receives a clock signal from the clock line, and
   wherein the pixel driving chip of each of the plurality of pixels arranged on the $2^{nd}$ to $n^{th}$ horizontal lines based on the length direction of the data line receives a clock signal from the pixel driving chip of a front stage pixel cascade-connected to one another.

15. A light emitting display apparatus including a plurality of pixels each connected to a clock line, a data line and a pixel power line, comprising:
   a plurality of pixel driving chips respectively connected to a plurality of data lines and a plurality of pixel driving power lines and sequentially outputting a driving current through a plurality of output terminals, wherein the clock line is first connected to the pixel driving chips among the plurality of pixels arranged along a first horizontal line and sequentially connected to the pixel driving chips among the plurality of pixels arranged along second to $n^{th}$ horizontal lines, where n is a natural number equal to or more than three; and
   a plurality of light emitting devices in each pixel respectively connected to the plurality of output terminals and sequentially receiving the driving current to emit light of different colors during a unit frame,
   wherein the pixel driving chip of each of the plurality of pixels arranged on the first horizontal line is connected in parallel to the clock line, and the pixel driving chip of each of the plurality of pixels arranged on the first to $n^{th}$ horizontal lines along the direction parallel to the data line is cascade-connected to one another by the clock line, and
   wherein the plurality of pixel driving chips includes:
   a switch control circuit connected to a data line and a clock line and outputting a plurality of driving switch control signals and a shift switch control signal; and
   a plurality of pixel driving circuits respectively corresponding to the plurality of driving switch control signals.

16. The light emitting display apparatus of claim 15, wherein the plurality of pixel driving chips receives a clock signal through the clock line connected to a pixel driving chip of a front stage pixel, shifts the received clock signal, and supplies the shifted clock signal to a pixel driving chip of a next stage pixel.

17. The light emitting display apparatus of claim 15, wherein the pixel driving chips of plurality of pixels arranged along the $n-1^{th}$ horizontal line respectively supply, through the clock line, an (n−1)-times-shifted clock signal to the pixel driving chips among the plurality of pixels arranged along the $n^{th}$ horizontal line.

18. The light emitting display apparatus of claim 15, wherein the switch control circuit includes:
   a switch control signal generator receiving a clock signal through the clock line to generate the plurality of driving switch control signals and the shift switch control signal; and
   a reset controller supplying a reset signal to the switch control signal generator.

19. The light emitting display apparatus of claim 18, wherein the reset controller generates the reset signal, based on a data signal received through the data line and the clock signal.

20. The light emitting display apparatus of claim 19, wherein the switch control signal generator generates the plurality of driving switch control signals and the shift switch control signal during a data transmission period, and the reset controller generates the reset signal and supplies the rest signal to the switch control signal generator during a blank period.

21. The light emitting display apparatus of claim 20, wherein the reset controller generates the reset signal when a driving voltage determined based on the data signal has a high level at least once while the clock signal is maintained at a high level in the blank period.

22. The light emitting display apparatus of claim 15, wherein the plurality of pixel driving circuits each includes:

a decoder connected to the data line to output a data signal;

a digital-analog converter connected to the decoder and the pixel driving power line to output a driving voltage;

a capacitor storing the driving voltage; and a driving transistor turned on based on the driving voltage.

23. The light emitting display apparatus of claim 15, wherein the pixel driving chip of each of the plurality of pixels arranged on the first horizontal line commonly receives a clock signal from the clock line, and wherein the pixel driving chip of each of the plurality of pixels arranged on the $2^{nd}$ to $n^{th}$ horizontal lines based on the length direction of the data line receives a clock signal from the pixel driving chip of a front stage pixel cascade-connected to one another.

* * * * *